United States Patent
Spencer et al.

(10) Patent No.: US 9,646,743 B2
(45) Date of Patent: *May 9, 2017

(54) HIGH VOLTAGE BUSHING COVER

(71) Applicant: Power Line Sentry, LLC, Fort Collins, CO (US)

(72) Inventors: Ronald K. Spencer, Meeker, CO (US); Stephen T. Kerr, Fort Collins, CO (US)

(73) Assignee: Power Line Sentry, LLC, Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/231,559

(22) Filed: Aug. 8, 2016

(65) Prior Publication Data
US 2016/0365179 A1 Dec. 15, 2016

Related U.S. Application Data

(63) Continuation of application No. 14/271,232, filed on May 6, 2014, now Pat. No. 9,413,153.

(51) Int. Cl.
| | |
|---|---|
| *H01B 7/00* | (2006.01) |
| *H01R 4/70* | (2006.01) |
| *H01B 17/26* | (2006.01) |
| *H01F 27/02* | (2006.01) |
| *H01B 19/00* | (2006.01) |
| *H02G 7/00* | (2006.01) |
| *H01B 17/00* | (2006.01) |
| *H05K 5/03* | (2006.01) |

(52) U.S. Cl.
CPC .............. *H01B 17/26* (2013.01); *H01B 17/00* (2013.01); *H01B 19/00* (2013.01); *H01F 27/02* (2013.01); *H02G 7/00* (2013.01); *H05K 5/03* (2013.01); *Y10T 29/49229* (2015.01)

(58) Field of Classification Search
CPC ...... H01B 19/00; H01B 17/00; H01B 17/005; H01B 17/56; H01B 17/26; H01F 27/02; H02G 7/00; H05K 5/03; Y10T 29/49229
USPC ......... 174/152 G, 153 G, 135, 152 R, 138 R, 174/139, 138 F, 137 R, 5 R, 14 BH; 361/232
See application file for complete search history.

(56) References Cited

U.S. PATENT DOCUMENTS

| | | |
|---|---|---|
| 2,875,267 A | 2/1959 | Sutton, Jr. |
| 3,238,291 A | 3/1966 | Bosch et al. |
| 3,639,678 A | 2/1972 | Muschong |
| 3,639,681 A | 2/1972 | Ettlinger |
| 3,824,676 A | 7/1974 | Ebert |
| 4,628,145 A | 12/1986 | Kolcio et al. |
| 4,707,562 A | 11/1987 | Whited |
| 4,845,307 A | 7/1989 | Cumming et al. |
| D357,458 S | 4/1995 | Tisbo |
| 5,650,594 A | 7/1997 | Urnovitz |
| 5,679,922 A | 10/1997 | Harben |
| 6,005,196 A | 12/1999 | Spillyards |

(Continued)

OTHER PUBLICATIONS

U.S. Appl. No. 14/271,232, filed May 6, 2014.

*Primary Examiner* — Angel R Estrada
(74) *Attorney, Agent, or Firm* — Craig R. Miles; CR MILES P.C.

(57) ABSTRACT

Bushing covers adapted to surround a bushing to protect the bushing and bushing connections from damage, which can be installed at distance using an insulated pole.

21 Claims, 30 Drawing Sheets

(56) References Cited

U.S. PATENT DOCUMENTS

| | | |
|---|---|---|
| 6,248,956 B1 | 6/2001 | Cook et al. |
| 6,255,597 B1 | 7/2001 | Bowling et al. |
| 6,291,774 B1 | 9/2001 | Williams |
| 6,486,785 B1 | 11/2002 | Hoth |
| 6,963,025 B1 | 11/2005 | Kysely |
| 6,995,313 B1 | 2/2006 | Barnett et al. |
| 7,297,869 B2 | 11/2007 | Hiller et al. |
| 7,301,096 B2 | 11/2007 | Strong et al. |
| D580,878 S | 11/2008 | Milner |
| 7,622,668 B1 | 11/2009 | Tollefson et al. |
| 7,772,499 B2 | 8/2010 | Rauckman |
| 7,839,256 B2 | 11/2010 | Bradford et al. |
| 9,413,153 B2 * | 8/2016 | Spencer et al. .......... H02G 7/00 |
| 2003/0015330 A1 | 1/2003 | Wood et al. |

\* cited by examiner

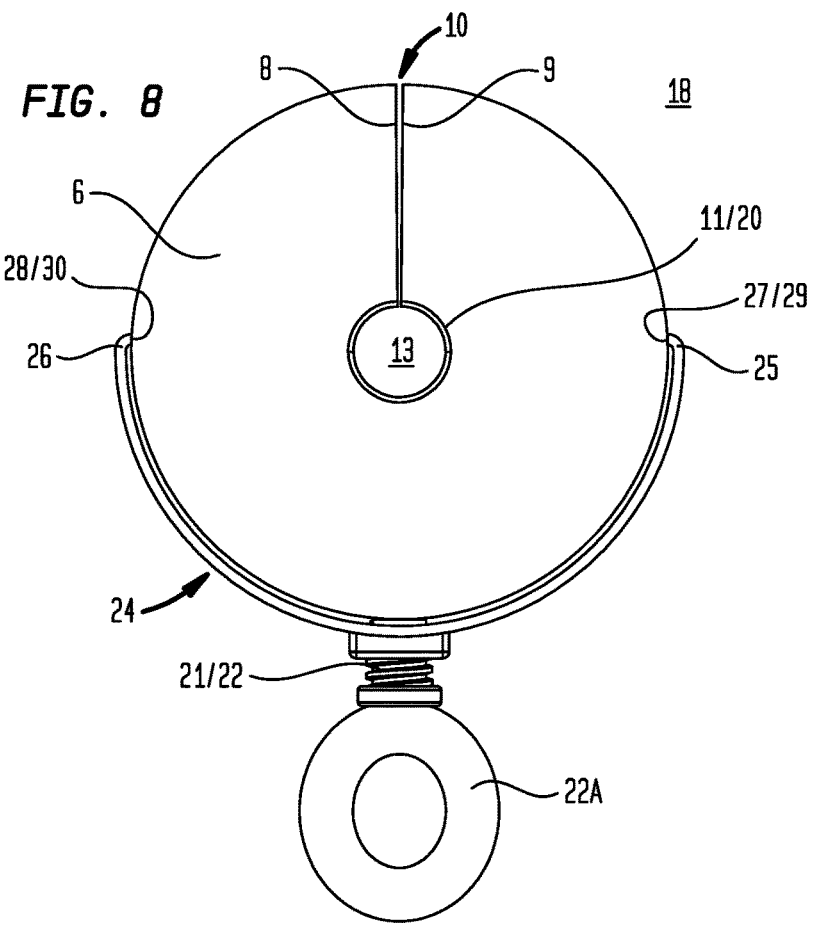
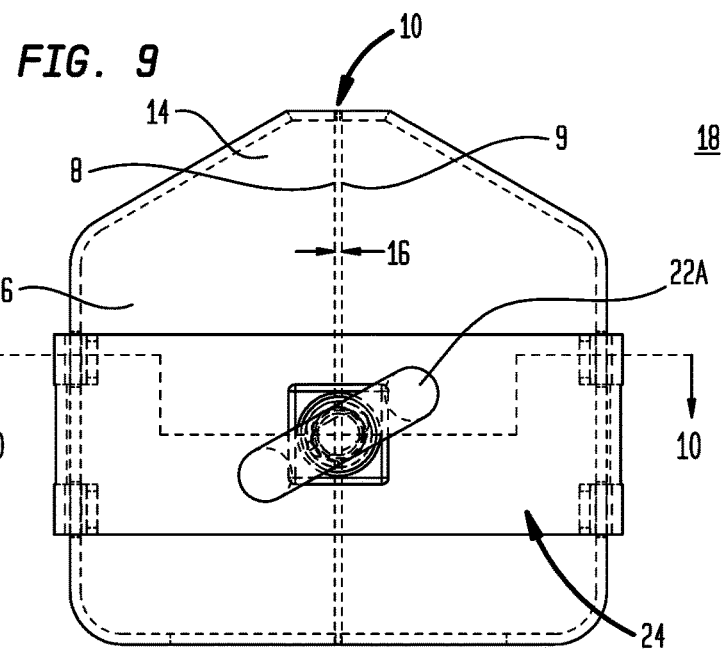

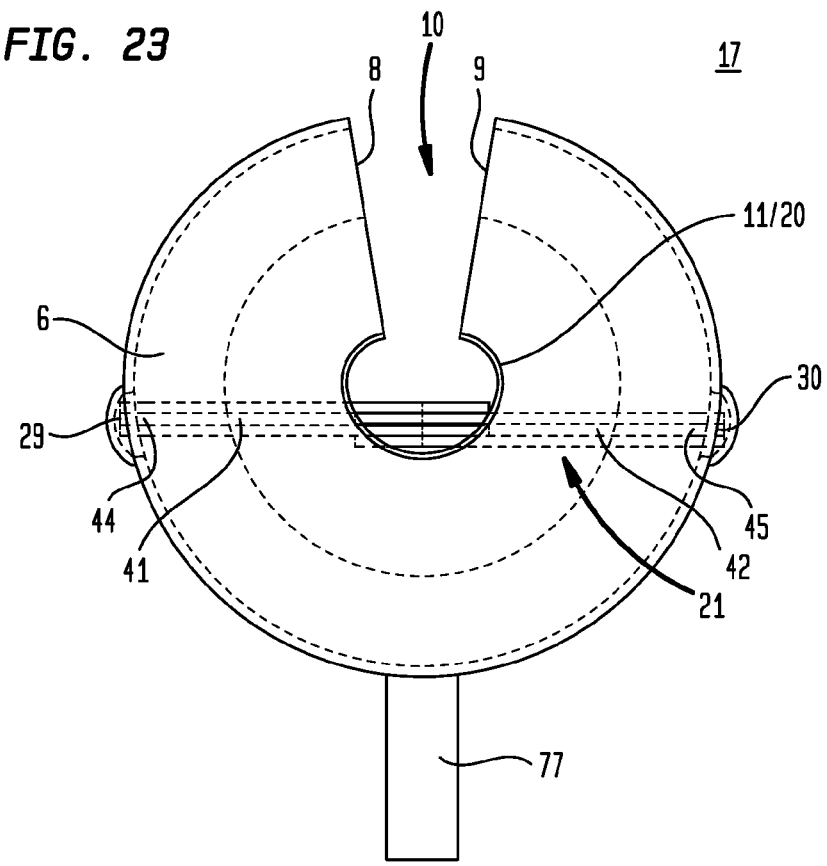
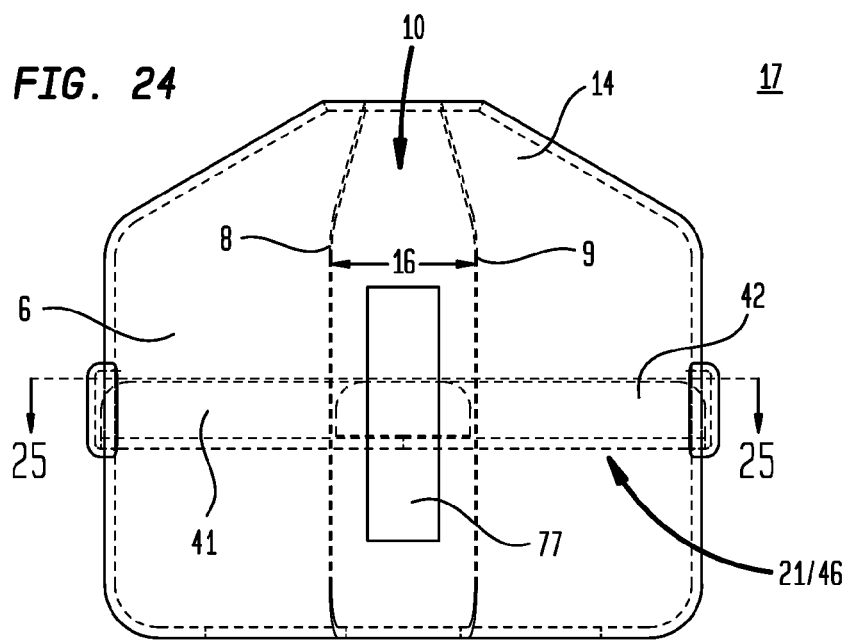

HIGH VOLTAGE BUSHING COVER

This United States Patent Application is a continuation of U.S. patent application Ser. No. 14/271,232, filed May 6, 2014, now U.S. Pat. No. 9,413,153, issued Aug. 9, 2016, hereby incorporated by reference herein.

I. FIELD OF THE INVENTION

Generally, bushing covers adapted to surround a bushing to protect the bushing and bushing connections from damage. Specifically, bushing covers which can be installed to surround a bushing and bushing connections at distance using an insulated pole.

II. BACKGROUND OF THE INVENTION

Bushings, including the bushing proper and bushing connections, such as bushing hardware and the conductor extending from the bushing, can be damaged by environmental stresses, debris, animals, or birds and can present a risk of electrical shock to wildlife or linemen. Therefore, utilities may strive to retrofit bushings with protective covers. However, installation of conventional protective covers may be complicated, time-consuming, or dangerous to install in live line work. To minimize the danger, electrical power to the transformer may be disconnected during the installation of conventional protective covers, which may be inconvenient, as this interrupts electrical service to the consumers.

Accordingly, a need exists for a bushing cover which can be readily installed to surround a bushing and bushing connections without disconnecting the electrical power to the transformer.

III. SUMMARY OF THE INVENTION

A broad object of particular embodiments of the invention can be to provide a bushing cover including a body having a pair of edges disposed in opposed relation to define a slit which communicates between a top aperture element and a bottom aperture element, the top and bottom aperture elements each communicating with a hollow interior of the body, the body resiliently deformable to adjust an amount of distance between the pair of edges; and a body deformation member which operably deforms the body to adjust the amount of distance between the pair of edges.

Another broad object of particular embodiments of the invention can be to provide a method of producing a bushing cover including a body having a pair of edges disposed in opposed relation to define a slit which communicates between a top aperture element and a bottom aperture element, the top and bottom aperture elements each communicating with a hollow interior of the body, the body resiliently deformable to adjust an amount of distance between the pair of edges; and a body deformation member which operably deforms the body to adjust the amount of distance between the pair of edges.

Another broad object of particular embodiments of the invention can be to provide a method of covering a bushing including obtaining a bushing cover having a body having a pair of edges disposed in opposed relation to define a slit which communicates between a top aperture element and a bottom aperture element, the top and bottom aperture elements each communicating with a hollow interior of the body, the body resiliently deformable to adjust an amount of distance between the pair of edges; and a body deformation member which operably deforms the body to adjust the amount of distance between the pair of edges.

Another broad object of particular embodiments of the invention can be to provide a bushing cover including a body having a body first portion and a body second portion coupled to rotate about a body portion rotation axis to engage the body first portion and the body second portion at a juncture to enclose a hollow interior of the body, which communicates between a top aperture element and a bottom aperture element; the body first portion and the body second portion each having one of a pair of securement aperture elements; a pass-through communicating between the pair of securement aperture elements; and a securing member having a securing member first end opposite a securing member second end, the securing member receivable by the pass-through to fix the body first portion in mated engagement with the body second portion.

Another broad object of particular embodiments of the invention can be to provide a method of producing a bushing cover including a body having a body first portion and a body second portion coupled to rotate about a body portion rotation axis to engage the body first portion and the body second portion at a juncture to enclose a hollow interior of the body, which communicates between a top aperture element and a bottom aperture element; the body first portion and the body second portion each having one of a pair of securement aperture elements; a pass-through communicating between the pair of securement aperture elements; and a securing member having a securing member first end opposite a securing member second end, the securing member receivable by the pass-through to fix the body first portion in mated engagement with the body second portion.

Another broad object of particular embodiments of the invention can be to provide a method of covering a bushing including obtaining a bushing cover having a body having a body first portion and a body second portion coupled to rotate about a body portion rotation axis to engage the body first portion and the body second portion at a juncture to enclose a hollow interior of the body, which communicates between a top aperture element and a bottom aperture element; the body first portion and the body second portion each having one of a pair of securement aperture elements; a pass-through communicating between the pair of securement aperture elements; and a securing member having a securing member first end opposite a securing member second end, the securing member receivable by the pass-through to fix the body first portion in mated engagement with the body second portion.

Naturally, further objects of the invention are disclosed throughout other areas of the specification, drawings, and claims.

IV. BRIEF DESCRIPTION OF THE DRAWINGS

FIG. 8 is a top view of a particular embodiment of the inventive bushing cover.

FIG. 9 is an end view of a particular embodiment of the inventive bushing cover.

FIG. 23 is a top view of a particular embodiment of the inventive bushing cover.

FIG. 24 is an end view of a particular embodiment of the inventive bushing cover.

V. DETAILED DESCRIPTION OF THE INVENTION

Figure 1:
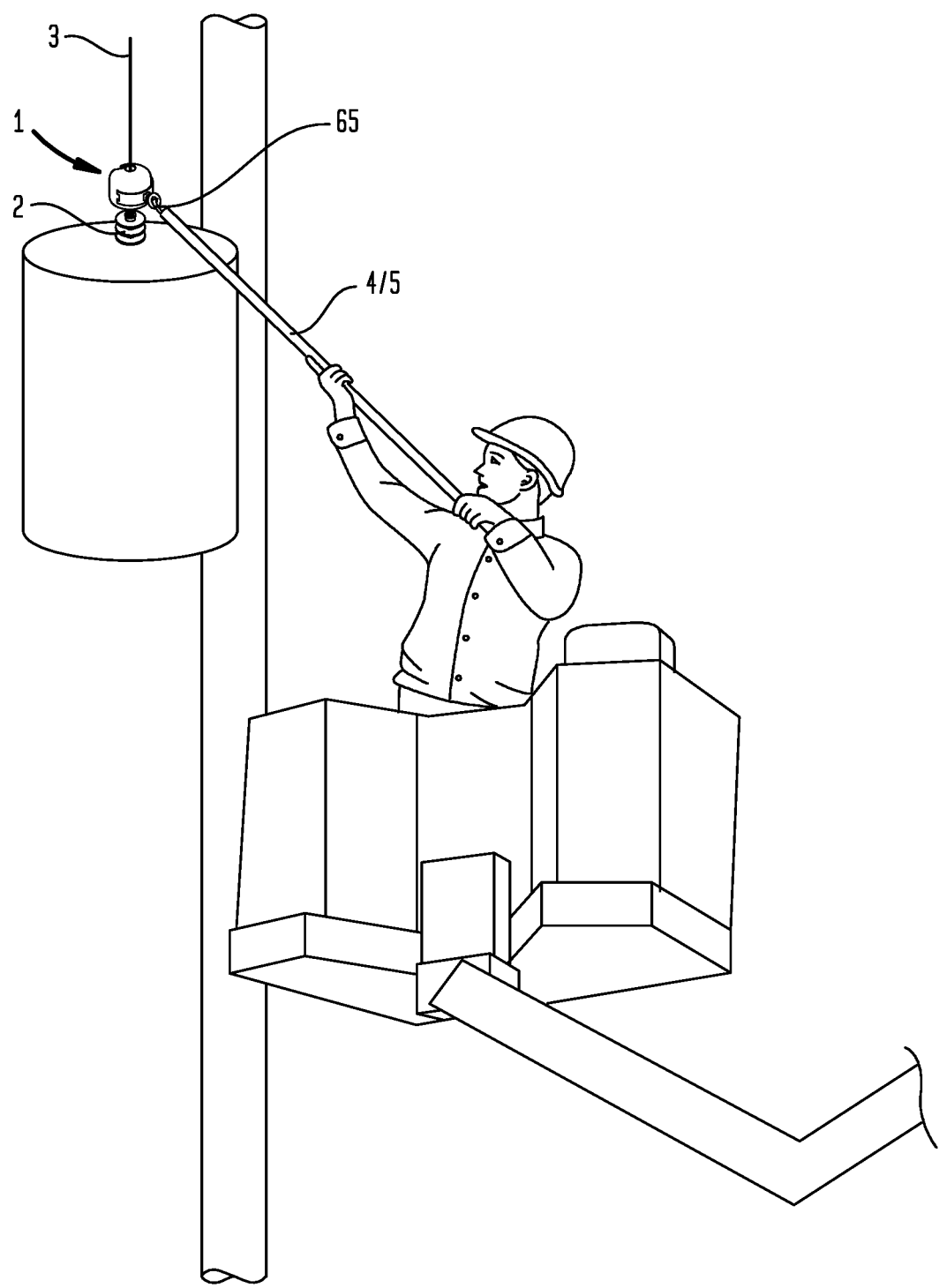
FIG. 1 is an illustration of a method of using a particular embodiment of the inventive bushing cover.
Figure 2:
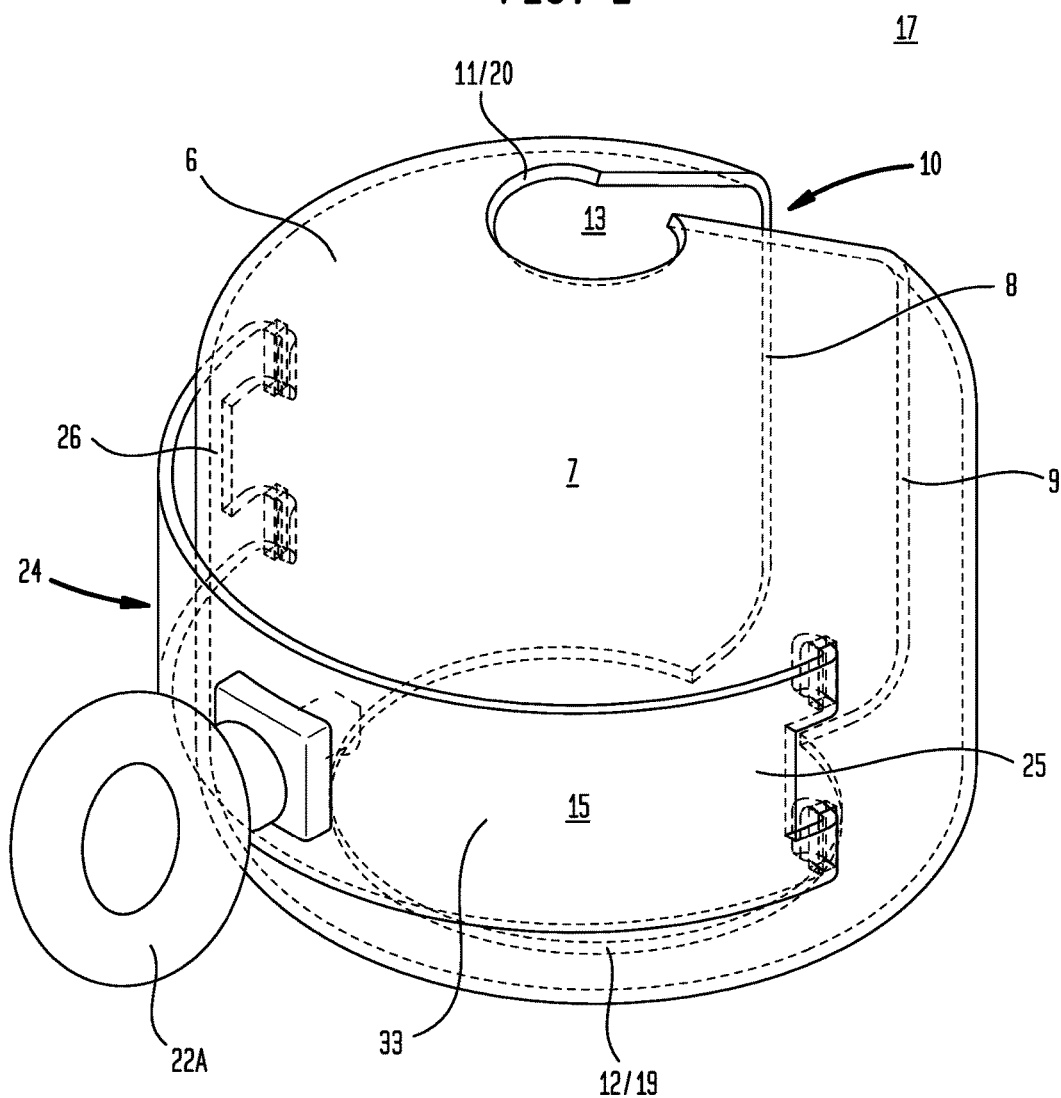
FIG. 2 is a perspective view of a particular embodiment of the inventive bushing cover.
Figure 3:
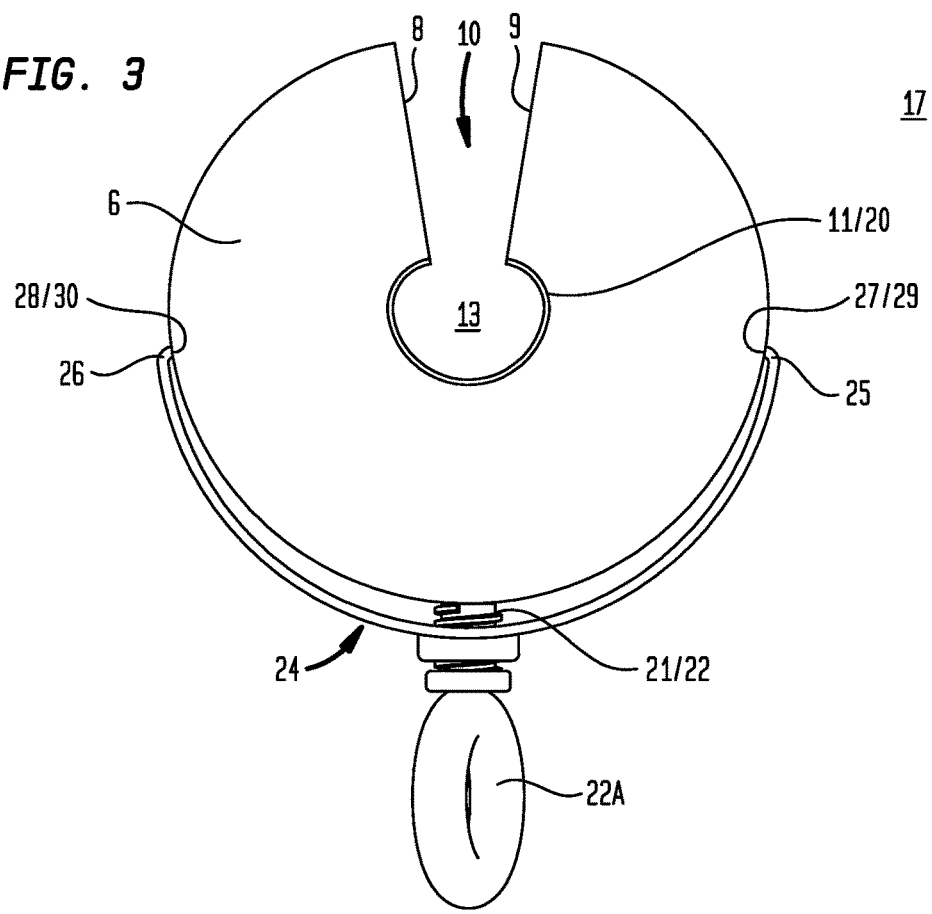
FIG. 3 is a top view of a particular embodiment of the inventive bushing cover.
Figure 4:
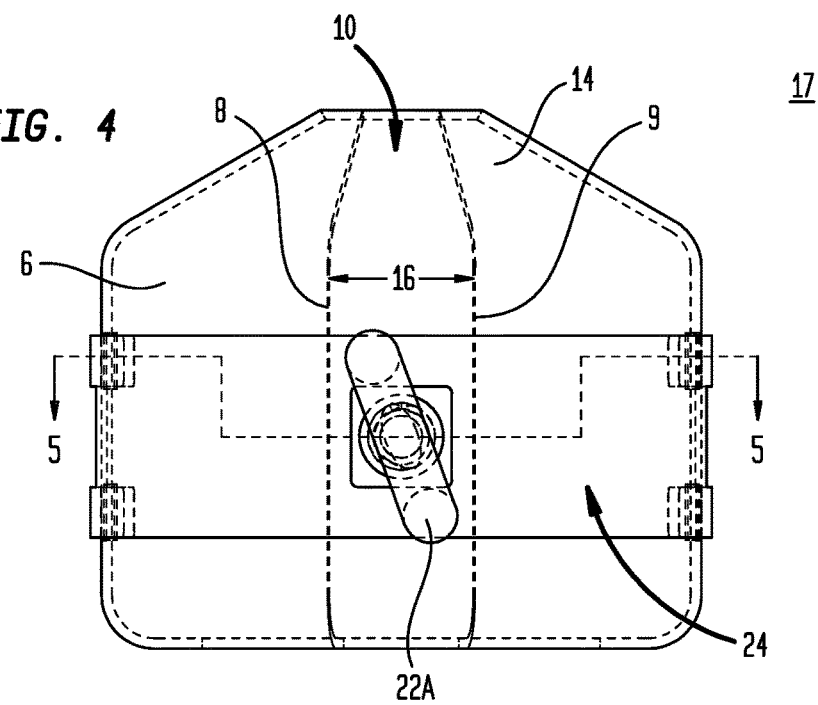
FIG. 4 is an end view of a particular embodiment of the inventive bushing cover.

Now referring primarily to FIG. 1, a method of using a particular embodiment of the inventive bushing cover (1) is shown. A bushing (2) along with the bushing hardware and a portion of the conductor (3) extending from the bushing (hereinafter "bushing connections") can be covered by installing the inventive bushing cover (1) to surround the bushing (2) and the bushing connections, which as to certain embodiments, can be facilitated by an insulated pole (4), for example a hot stick (5).

For the purposes of this invention, the term "bushing" means an electrically insulating lining to protect a through conductor.

Now referring primarily to FIG. 2 through FIG. 31, particular embodiments of the inventive bushing cover (1) can include a body (6) having a hollow interior (7). A pair of edges (8)(9) disposed in opposed relation to define a slit (10) communicate between a top aperture element (11) and a bottom aperture element (12) disposed within the body (6). The body (6) can be configured in any of a wide variety of configurations having varying dimensions which define a hollow interior (7) configured for receiving a correspondingly wide variety of configurations of bushings (2) and bushing connections within the hollow interior (7) of the body (6). As an illustrative example, the body (6) can have a generally cylindrical configuration, which can be receive a generally cylindrical bushing (2) and bushing connections within the hollow interior (7) of the body (6).

Now referring primarily to FIG. 2, FIG. 3, FIG. 7, FIG. 8, FIG. 12, FIG. 13, FIG. 17, FIG. 18, FIG. 22, FIG. 23, FIG. 27, and FIG. 28, the top aperture element (11) can bound a top aperture element opening (13) communicating with the hollow interior (7) of the body (6). The top aperture element (11) can be configured to dispose about a conductor (3) extending from a bushing (2) received inside of the hollow interior (7) of the body (6). As to particular embodiments, a generally cylindrical body (6) can have a body upper portion (14) which tapers inwardly approaching a generally circular top aperture element (11), whereby the inwardly tapering body upper portion (14) can be disposed about a conductor (3) extending from a generally cylindrical bushing (2) received inside of the hollow interior (7) of the generally cylindrical body (6).

Now referring primarily to FIG. 2, FIG. 5, FIG. 7, FIG. 10, FIG. 12, FIG. 15, FIG. 17, FIG. 20, FIG. 22, FIG. 25, FIG. 27, and FIG. 30, the bottom aperture element (12) can bound a bottom aperture element opening (15) communicating with the hollow interior (7) of the body (6). The bottom aperture element (12) can be configured to dispose about a bushing (2) received inside of the hollow interior (7) of the body (6). As to particular embodiments, the bottom aperture element (12) can bound a generally circular bottom aperture element opening (15), which can insertingly receive and retain a generally cylindrical bushing (2) received inside of the hollow interior (7) of a generally cylindrical body (6).

Now referring primarily to FIG. 2 through FIG. 5, FIG. 7 through FIG. 10, FIG. 12 through FIG. 15, FIG. 17 through FIG. 20, FIG. 22 through FIG. 25, and FIG. 27 through FIG. 30, the slit (10), communicating between the top aperture element (11) and the bottom aperture element (12), can be defined by a pair of edges (8)(9) of the body (6) which can be resiliently deformed to adjust an amount of distance (16) between the pair of edges (8)(9) (as shown in the example of FIG. 4, FIG. 9, FIG. 14, FIG. 16, FIG. 24, and FIG. 29). For example, in a bushing cover open condition (17) (as shown in the example of FIG. 2 through FIG. 6, FIG. 12 through FIG. 16, and FIG. 22 through FIG. 26), the amount of distance (16) between the pair of edges (8)(9) can be increased by deforming the body (6) to allow a bushing (2) to pass between the pair of edges (8)(9). As such, the bushing (2) can be received inside of the hollow interior (7) of the body (6).

Now referring primarily to FIG. 7 through FIG. 11, FIG. 17 through FIG. 21, and FIG. 27 through FIG. 31, in a bushing cover closed condition (18), the amount of distance (16) between the pair of edges (8)(9) can be decreased to configure a bottom aperture element periphery (19) of the bottom aperture element (12) about a bushing (2) received inside of the hollow interior (7) of the body (6). As to particular embodiments, the bottom aperture element periphery (19) can engage the bushing (2) to securely retain the inventive bushing cover (1) about the bushing (2). Additionally, in a bushing cover closed condition (18), the amount of distance (16) between the pair of edges (8)(9) can be decreased to configure a top aperture element periphery (20) of the top aperture element (11) about a conductor (3) extending from a bushing (3) received inside of the hollow interior (7) of the body (6).

Now referring primarily to FIG. 2 through FIG. 31, particular embodiments of the inventive bushing cover (1) can further include a body deformation member (21) which can operably deform the body (6) to adjust the amount of distance (16) between the pair of edges (8)(9). Now referring primarily to FIG. 2 through FIG. 21, particular embodiments of the body deformation member (21) can include a linear deformation member (22) having a member terminal end (23) which contacts or couples to the body (6). The member terminal end (23) can be positionably locatable to deform the body (6) to adjust the amount of distance (16) between the pair of edges (8)(9). As an illustrative example, the member terminal end (23) can be positionably located to deform the body (6) to increase or decrease the amount of distance (16) between the pair of edges (8)(9). As an illustrative example, the member terminal end (23) can be positionably located to engage the body (6) generally opposite of the slit (10). Advancing the member terminal end (23) toward the slit (10) can correspondingly increase the amount of distance (16) between the pair of edges (8)(9) to approach or achieve the bushing cover open condition (17) (as shown in the example of FIG. 2 through FIG. 6 and FIG. 12 through FIG. 16). The member terminal end (23) can be positionably located to achieve an amount of distance (16) between the pair of edges (8)(9) to allow a bushing (2) to pass between the pair of edges (8)(9) and be received inside of the hollow interior (7) of the body (6). Similarly, the member terminal end (23) positionably located to engage the body (6) generally opposite the slit (10) can deform the body (6) to decrease the amount of distance (16) between the pair of edges (8)(9). As an illustrative example, by advancing the member terminal end (23) away from the slit (10) the amount of distance (16) between the pair of edges (8)(9) can be decreased to dispose the inventive bushing cover (1) toward or in the bushing cover closed condition (18) (as shown in the example of FIG. 7 through FIG. 11 and FIG. 17 through FIG. 21). The inventive bushing cover (1) in the bushing cover closed condition (18) can position the pair of edges (8)(9) in adjacent proximate or engaged relation to securely retain a bushing (2) inside of the hollow interior (7) of the body (6).

Again referring primarily to FIG. 2 through FIG. 21, the body deformation member (21) can further include an arcuate member (24) having arcuate member first and second ends (25)(26). The arcuate member first and second ends (25)(26) can be coupled to the body (6) at a corresponding pair of fixed locations (27)(28). As an illustrative example, the arcuate member first and second ends (25)(26) can be coupled at a pair of fixed locations (27)(28) on opposed body sides (29)(30) of the body (6). As to particular embodiments, the pair of fixed locations (27)(28) can be circumferentially about equidistant from a corresponding one of the pair of edges (8)(9).

Again referring primarily to FIG. 2 through FIG. 21, the linear deformation member (22) can be operably coupled to the arcuate member (24) at a location which allows positional location of the member terminal end (23) to correspondingly increase or decrease the chord length (31) between the arcuate member first and second ends (25)(26) coupled to corresponding opposed body sides (29)(30) in relation to variable adjustment of the diameter of the body (6) (as shown in the example of FIG. 5, FIG. 10, FIG. 15, and FIG. 20). As an illustrative example, advancement of the member terminal end (23) toward the slit (10) can increase the chord length (31) between the arcuate member first and second ends (25)(26) coupled to corresponding opposed body sides (29)(30), thereby increasing the amount of distance (16) between the pair of edges (8)(9). As such, the inventive bushing cover (1) can be disposed toward the bushing cover open condition (17) (as shown in the example of FIG. 2 through FIG. 6 and FIG. 12 through FIG. 16), allowing a bushing (2) to pass between the pair of edges (8)(9) and be received inside of the hollow interior (7) of the body (6). Alternatively, the member terminal end (23) can be advanced away from the slit (10), which can decrease the chord length (31) between the arcuate member first and second ends (25)(26) coupled to corresponding opposed body sides (29)(30), thereby decreasing the amount of distance (16) between the pair of edges (8)(9). As such, the inventive bushing cover (1) can be disposed toward the bushing cover closed condition (18) (as shown in the example of FIG. 7 through FIG. 11 and FIG. 17 through FIG. 21), thereby surrounding a bushing (2) and bushing connections, passed between the pair of edges (8)(9) and received inside of the hollow interior (7) of the body (6).

Again referring primarily to FIG. 2 through FIG. 21, the body deformation member (21) and the arcuate member (24) can be operably coupled by mated spiral threads (32), whereby rotation of the linear deformation member (22)

positionably locates the member terminal end (23) contacting or coupled to the body (6) to adjust the amount of distance (16) between the pair of edges (8)(9). As an illustrative example, clockwise rotation of the linear deformation member (22) can advance the member terminal end (23) toward the slit (10), thus increasing the chord length (31) of the arcuate member (24) and the amount of distance (16) between the pair of edges (8)(9); as such, the inventive bushing cover (1) can be disposed toward the bushing cover open condition (17) (as shown in the example of FIG. 2 through FIG. 6 and FIG. 12 through FIG. 16). Alternatively, counterclockwise rotation of the linear deformation member (22) can locate the member terminal end (23) away from the slit (10), thus decreasing the chord length (31) of the arcuate member (24) and the amount of distance (16) between the pair of edges (8)(9); as such, the inventive bushing cover (1) can be disposed toward the bushing cover closed condition (18) (as shown in the example of FIG. 7 through FIG. 11 and FIG. 17 through FIG. 21).

Again referring primarily to FIG. 2 through FIG. 21, the arcuate member (24) can have an arcuate member length (33) disposed between the arcuate member first and second ends (25)(26). The arcuate member length (33) can be disposed adjacent to a body external surface (34) of the body (6) (as shown in the example of FIG. 2 through FIG. 11) or a body internal surface (35) of the body (6) (as shown in the example of FIG. 12 through FIG. 21). As to particular embodiments, the arcuate member ends (25)(26) can be coupled directly to the corresponding body external surface (34) or body internal surface (35) adjacent the arcuate member length (33). As to particular embodiments, the arcuate member ends (25)(26) can correspondingly pass through a slot (36) communicating between the body external surface (34) and the body internal surface (35).

Figure 5:
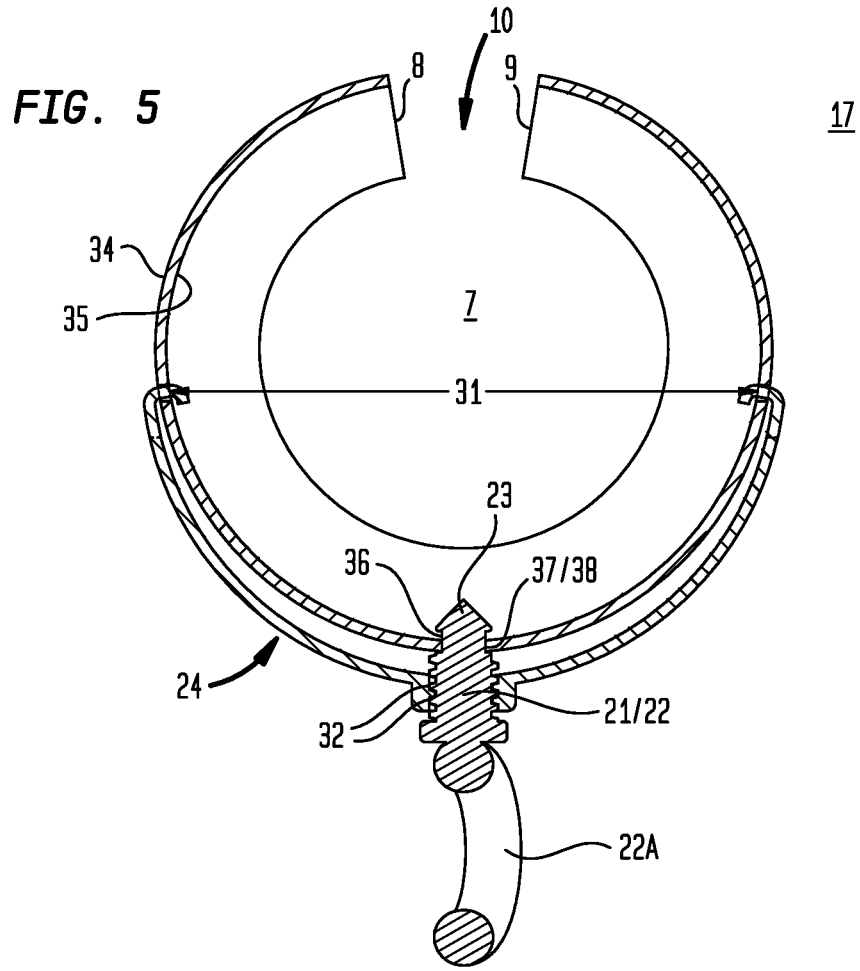
FIG. 5 is a cross-sectional view 5-5 of the particular embodiment of the inventive busing cover shown in FIG. 4.
Figure 6:
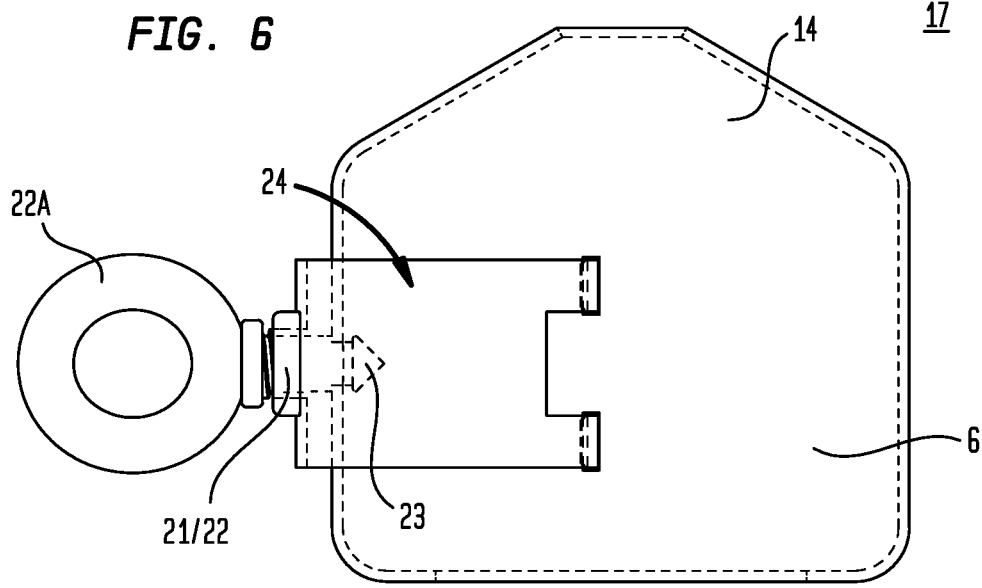
FIG. 6 is a side view of a particular embodiment of the inventive bushing cover.
Figure 7:
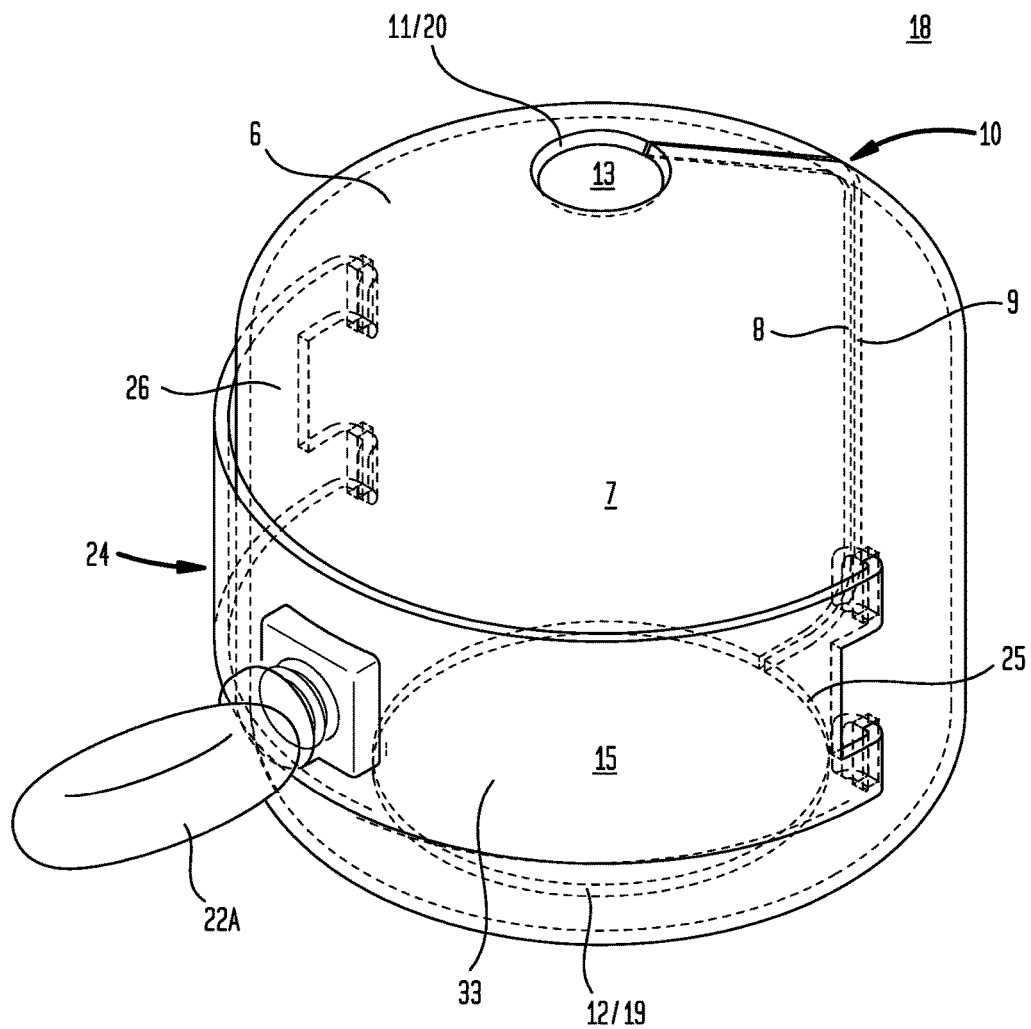
FIG. 7 is a perspective view of a particular embodiment of the inventive bushing cover.
Figure 10:
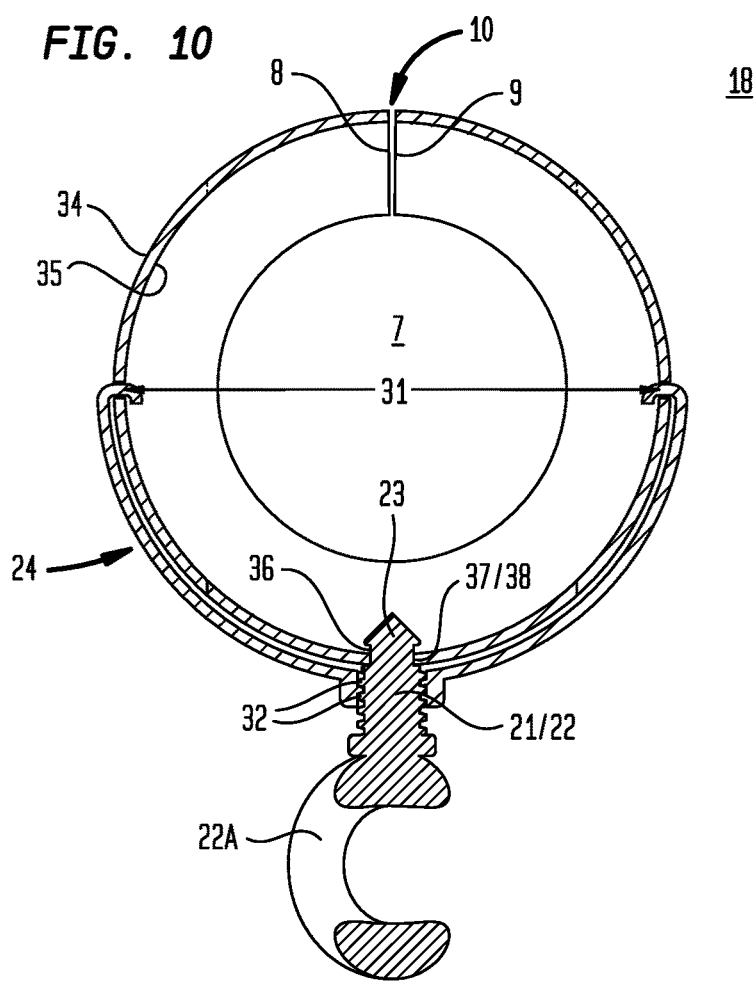
FIG. 10 is a cross-sectional view 10-10 of the particular embodiment of the inventive busing cover shown in FIG. 9.
Figure 11:
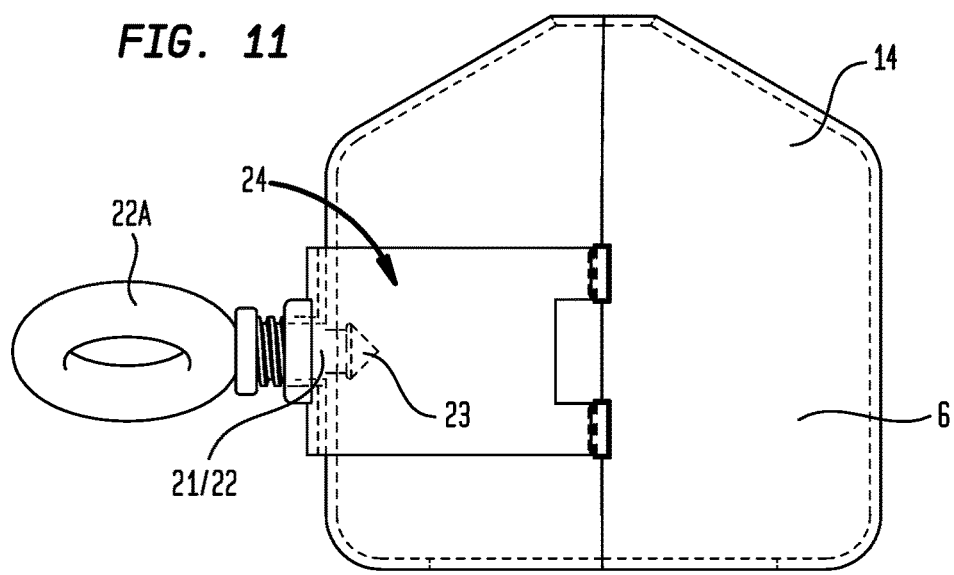
FIG. 11 is a side view of a particular embodiment of the inventive bushing cover.
Figure 12:
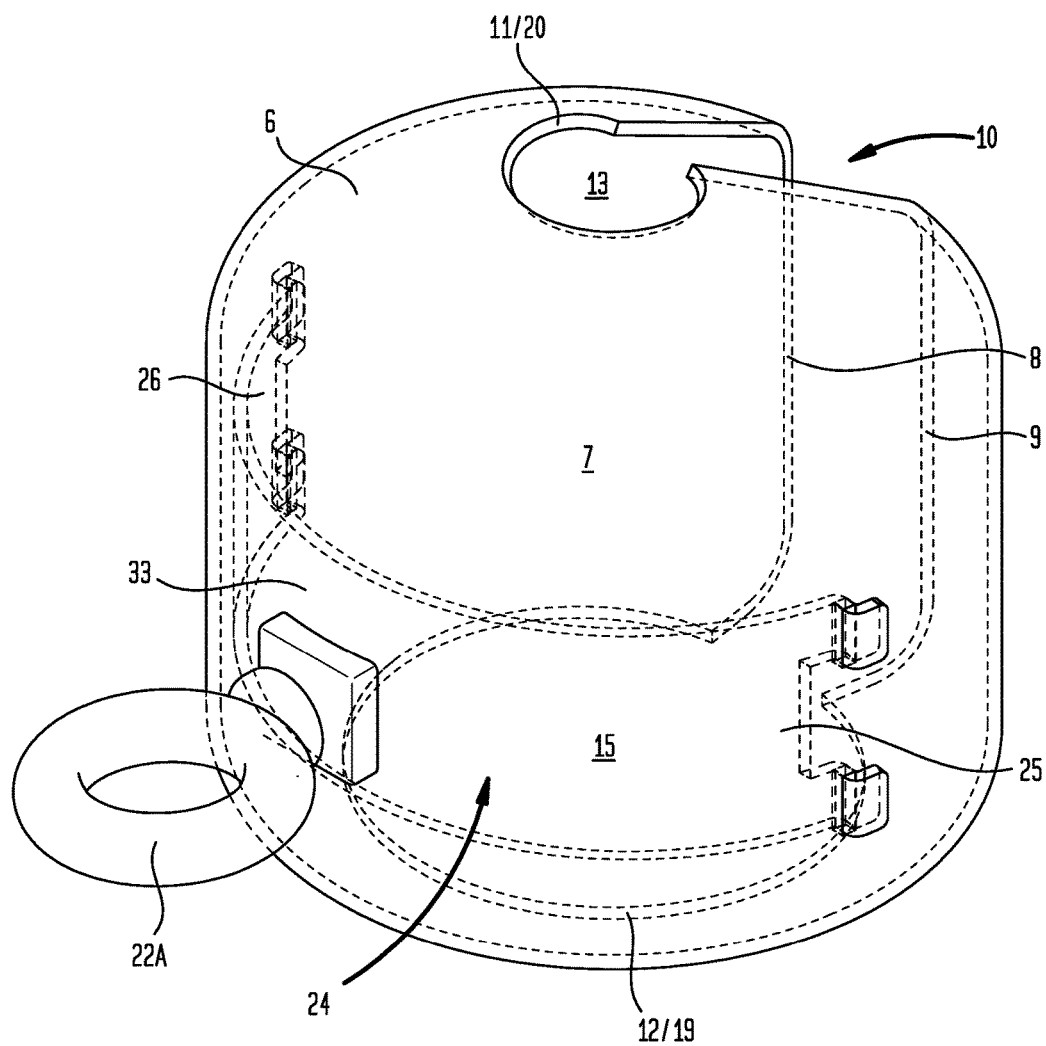
FIG. 12 is a perspective view of a particular embodiment of the inventive bushing cover.
Figure 13:
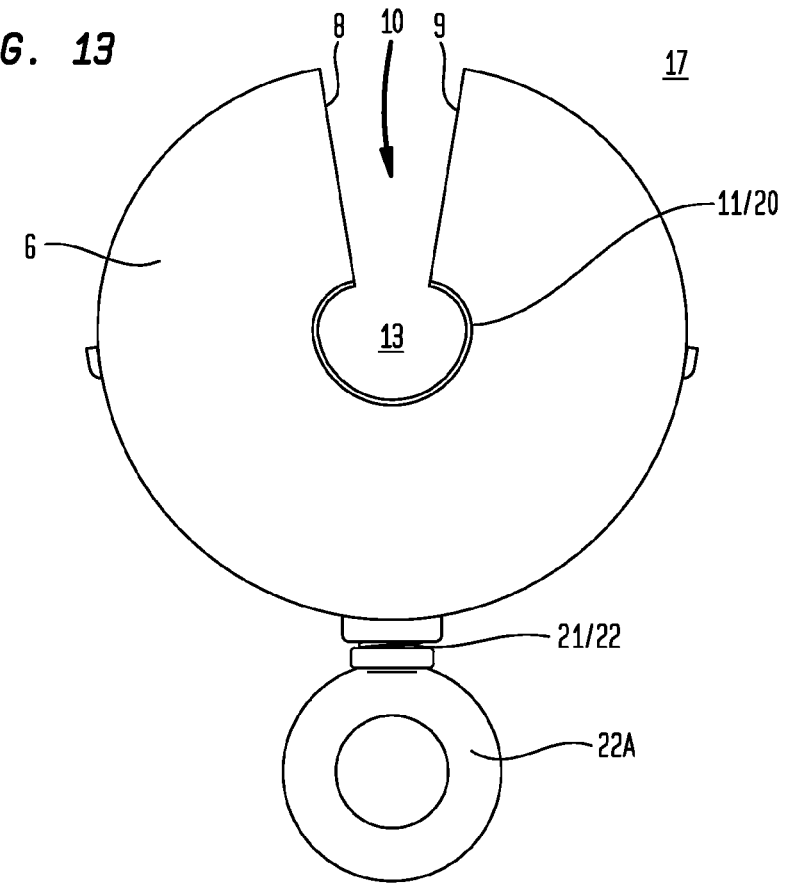
FIG. 13 is a top view of a particular embodiment of the inventive bushing cover.
Figure 14:
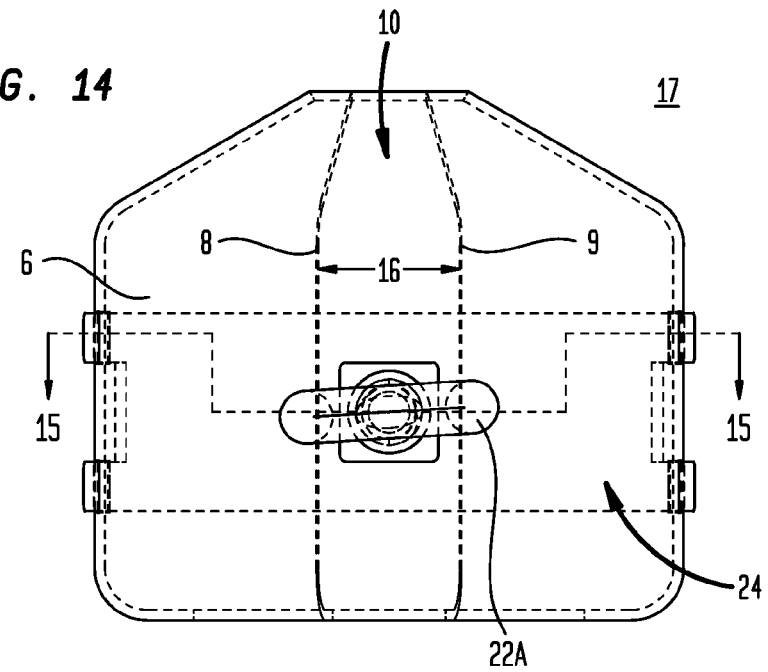
FIG. 14 is an end view of a particular embodiment of the inventive bushing cover.

Now referring primarily to FIG. 5 and FIG. 10, particular embodiments of the inventive bushing cover (1) can have the arcuate member (24) disposed adjacent to the body external surface (35). The arcuate member first and second ends (25)(26) can be coupled to the body (6) at a corresponding pair of fixed locations (27)(28), as above described. The linear deformation member (22) can be operably coupled to the arcuate member (24) by mated spiral threads (32) to dispose the member terminal end (23) in opposed relation to the body (6) opposite the slit (10). The member terminal end (23) can contact or be coupled to the body (6). As to particular embodiments, the member terminal end (23) can be rotatably fixedly coupled to the body (6). As one illustrative example, an annular recess (36) can be coupled to the member terminal end (23) of the linear deformation member (22). The linear deformation member (22) can be disposed in a body aperture element (37) to engage the body aperture element periphery (38) in the annular recess (36). As such, clockwise rotation of the linear deformation member (22) can advance the member terminal end (23) toward the slit (10) and correspondingly advance the body (6) toward the slit (10), thereby increasing the chord length (31) between arcuate member ends (25)(26) and increasing the amount of distance (16) between the pair of edges (8)(9) to dispose the inventive bushing cover (1) toward the bushing cover open condition (17) (as shown in the example of FIG. 5). Conversely, counterclockwise rotation of the linear deformation member (22) can advance the member terminal end (23) away from the slit (10), which correspondingly advances the body (6) away from the slit (10), thereby decreasing the chord length (31) between the arcuate member ends (25)(26) and decreasing the amount of distance (16) between the pair of edges (8)(9), thus disposing the inventive bushing cover (1) toward the bushing cover closed condition (18) (as shown in the example of FIG. 10).

Figure 15:
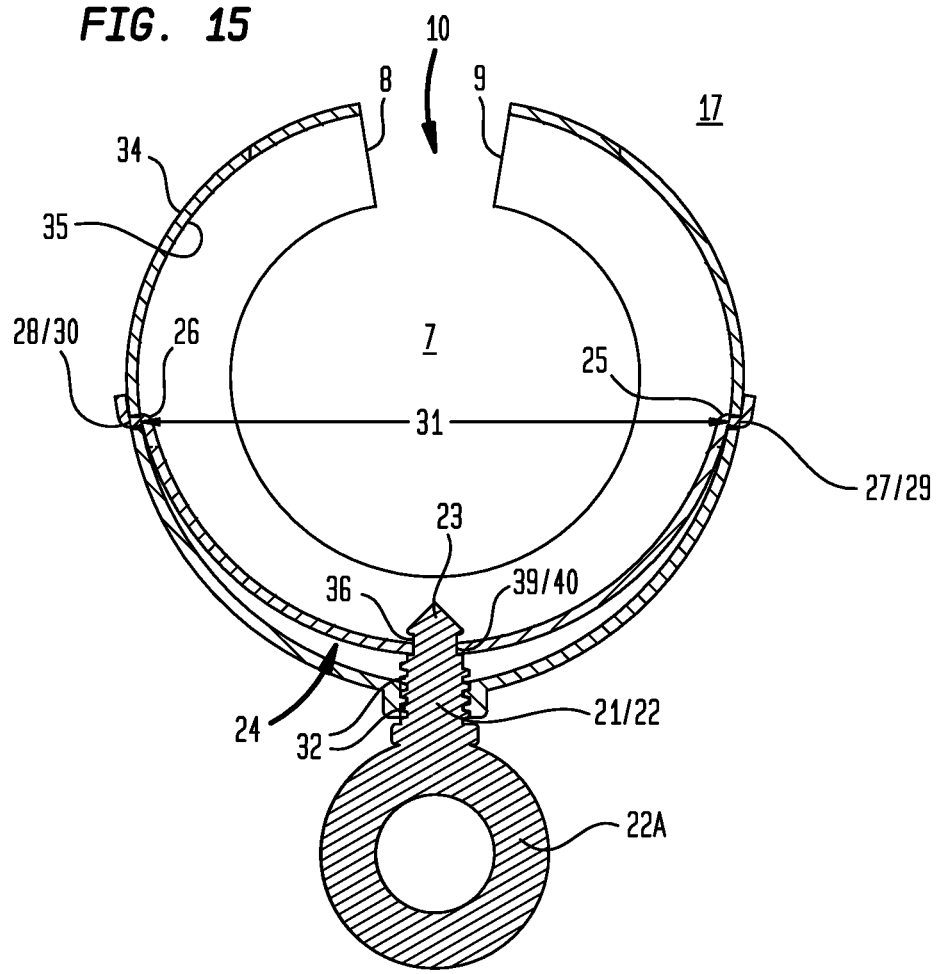
FIG. 15 is a cross-sectional view 15-15 of the particular embodiment of the inventive busing cover shown in FIG. 14.
Figure 16:
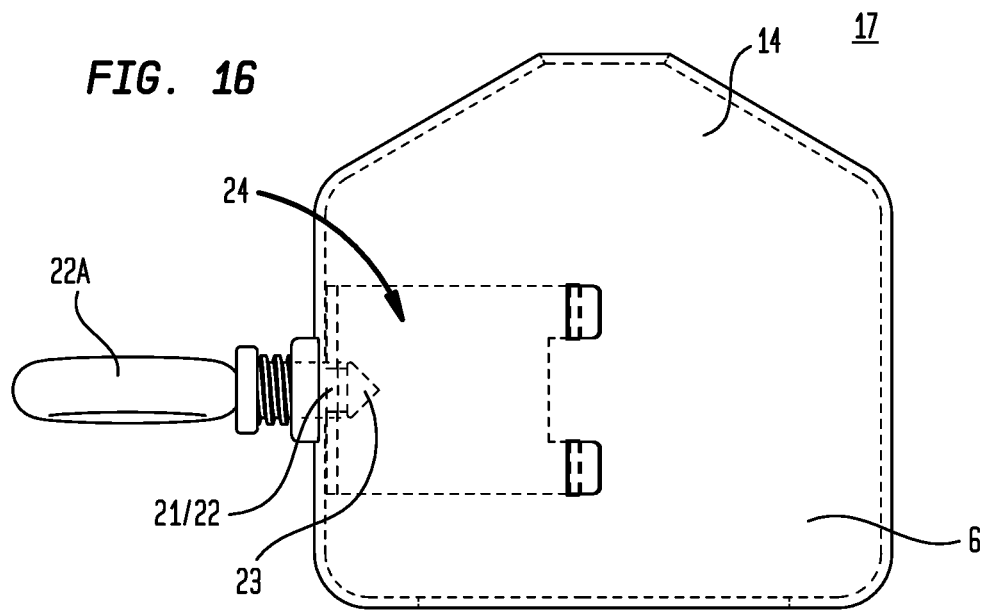
FIG. 16 is a side view of a particular embodiment of the inventive bushing cover.
Figure 17:
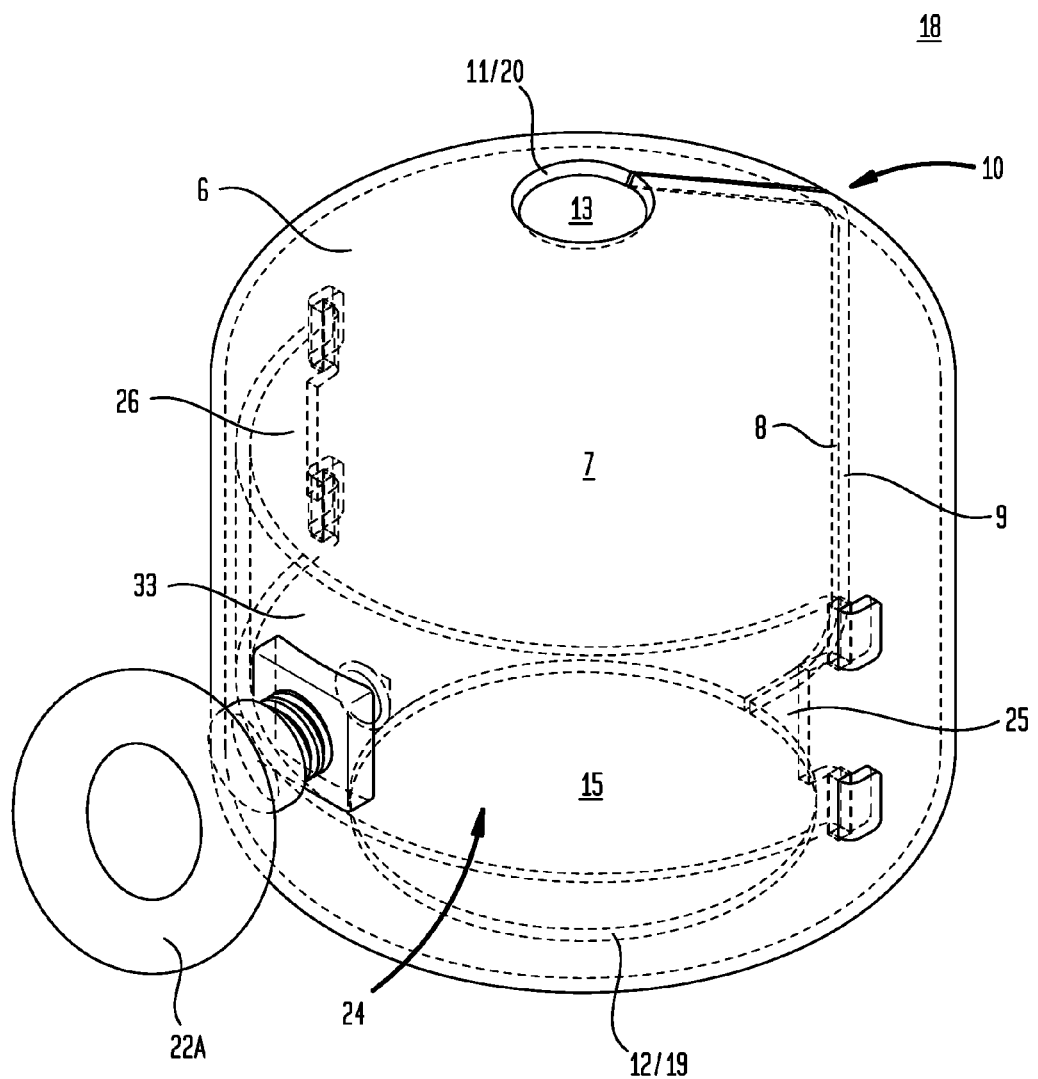
FIG. 17 is a perspective view of a particular embodiment of the inventive bushing cover.
Figure 18:
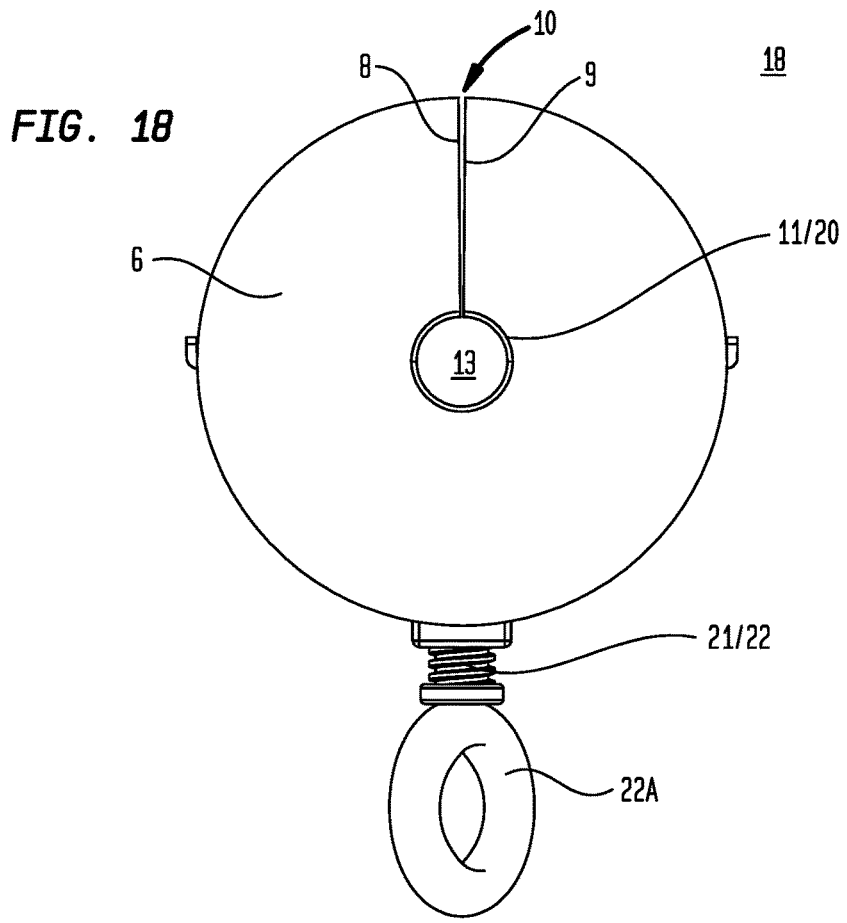
FIG. 18 is a top view of a particular embodiment of the inventive bushing cover.
Figure 19:
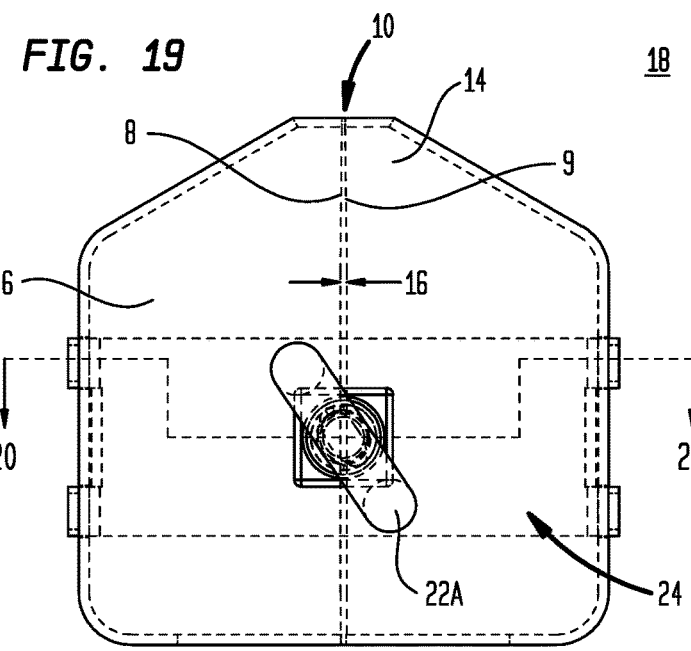
FIG. 19 is an end view of a particular embodiment of the inventive bushing cover.
Figure 20:
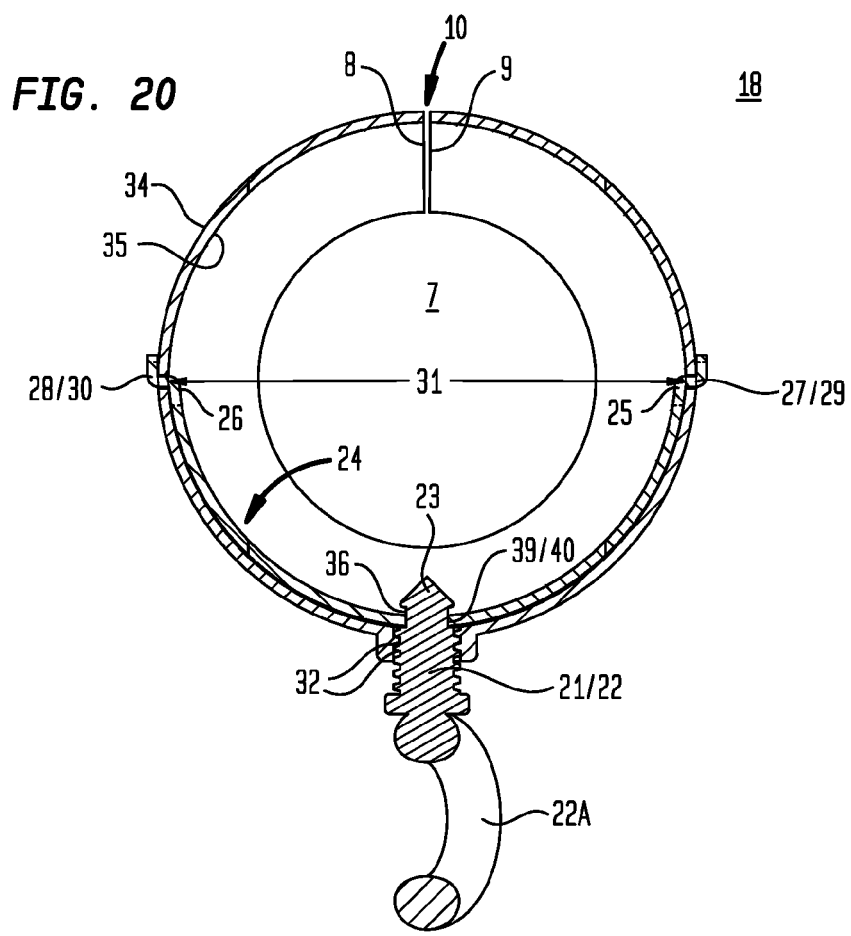
FIG. 20 is a cross-sectional view 20-20 of the particular embodiment of the inventive busing cover shown in FIG. 19.
Figure 21:
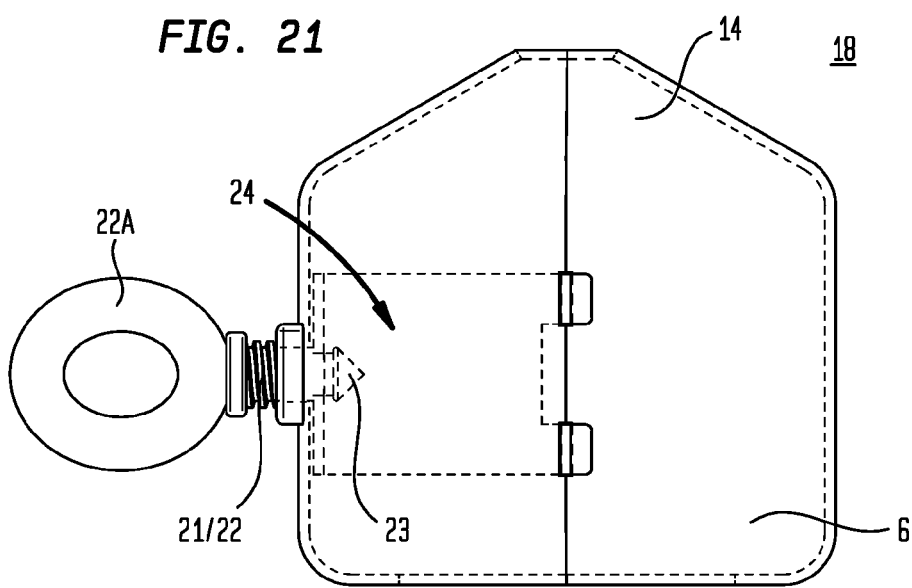
FIG. 21 is a side view of a particular embodiment of the inventive bushing cover.
Figure 22:
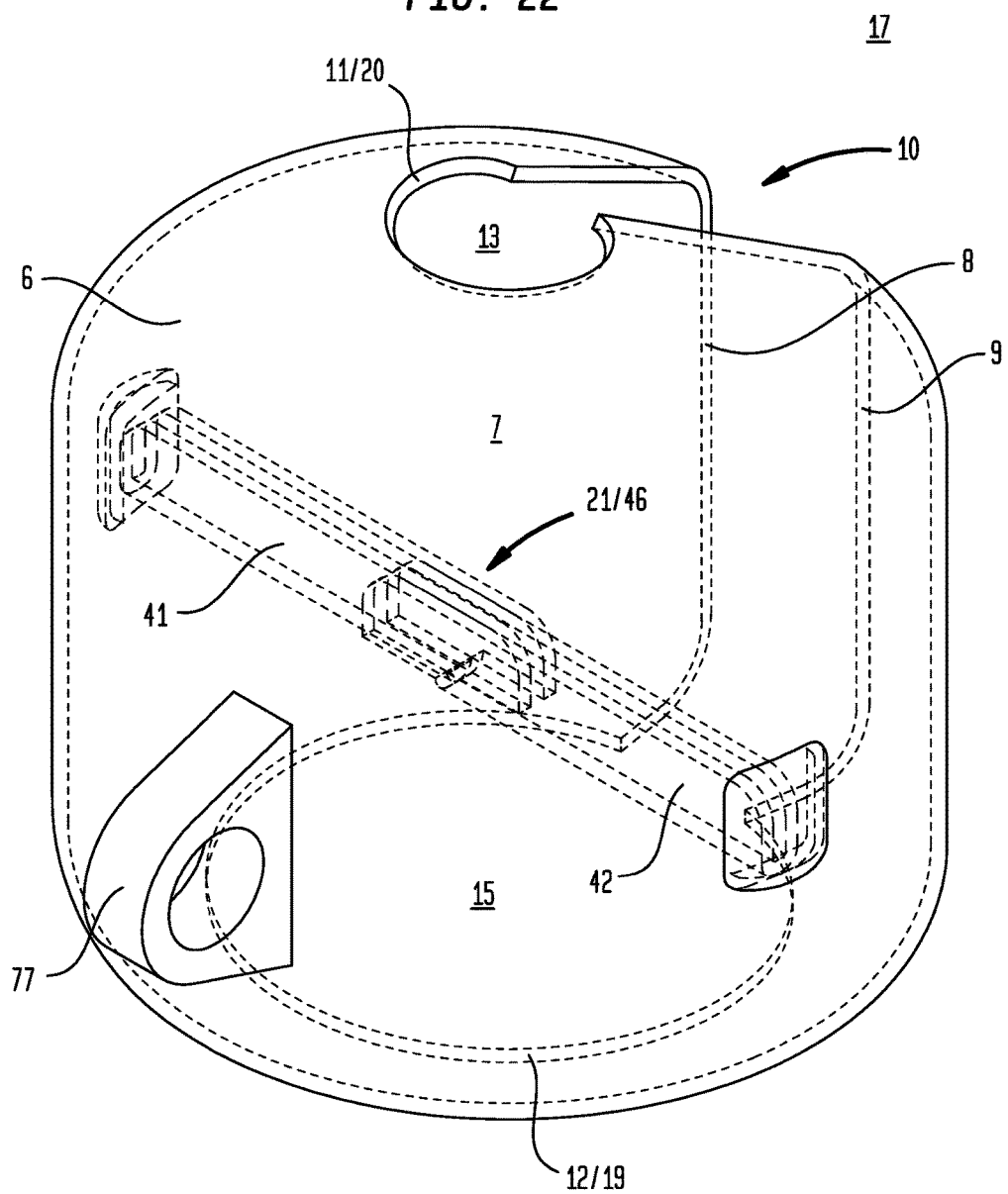
FIG. 22 is a perspective view of a particular embodiment of the inventive bushing cover.

Now referring primarily to FIG. 15 and FIG. 20, particular embodiments of the inventive bushing cover (1) can have the arcuate member (24) disposed adjacent to the body internal surface (35). The linear deformation member (22) can be rotatably matably engaged in the body aperture element (37) by mate spiral threads (32). As such, the linear deformation member (22) can be positionably located in relation to the body (6). Additionally, the linear deformation member (22) can have a member terminal end (23) rotatably fixedly connected to the arcuate member (24) disposed in adjacent relation to the internal body surface (25). As one illustrative example, an annular recess (36) can be coupled to the member terminal end (23) of the linear deformation member (22). The linear deformation member (22) can be disposed in an arcuate member aperture element (39) to engage the arcuate member aperture element periphery (40) in the annular recess (36). As such, clockwise rotation of the linear deformation member (22) can advance the member terminal end (23) toward the slit (10), which can correspondingly advance the arcuate member (24) toward the slit (10), thereby increasing the chord length (31) between arcuate member ends (25)(26) and increase the amount of distance (16) between the pair of edges (8)(9), thus disposing the inventive bushing cover (1) toward the bushing cover open condition (17) (as shown in the example of FIG. 15). Conversely, counterclockwise rotation of the linear deformation member (22) can advance the member terminal end (23) away from the slit (10), which can correspondingly advance the arcuate member (24) away from the slit (20), thereby decreasing the chord length (31) between the arcuate member ends (25)(26) and decreasing the amount of distance (16) between the pair of edges (8)(9), thus disposing the inventive bushing cover (1) toward the bushing cover closed condition (18) (as shown in the example of FIG. 20).

Now referring primarily to FIG. 1 through FIG. 21, the linear deformation member (22) can further include an annular member (22A) coupled to the linear deformation member (22) opposite the member terminal end (23). As to particular embodiments, the annular member (22A) can be configured to matingly engage with an insulated pole (4) which, upon releasable mated engagement with the annular member (22A), can facilitate rotation of the linear deformation member (22) to adjust the amount of distance (16) between the pair of edges (8)(9), thereby disposing the inventive bushing cover (1) toward the bushing cover open condition (17) (as shown in the example of FIG. 2 through FIG. 6 and FIG. 12 through FIG. 16) or toward the bushing cover closed condition (18) (as shown in the example of FIG. 7 through FIG. 11 and FIG. 17 through FIG. 21).

Figure 25:
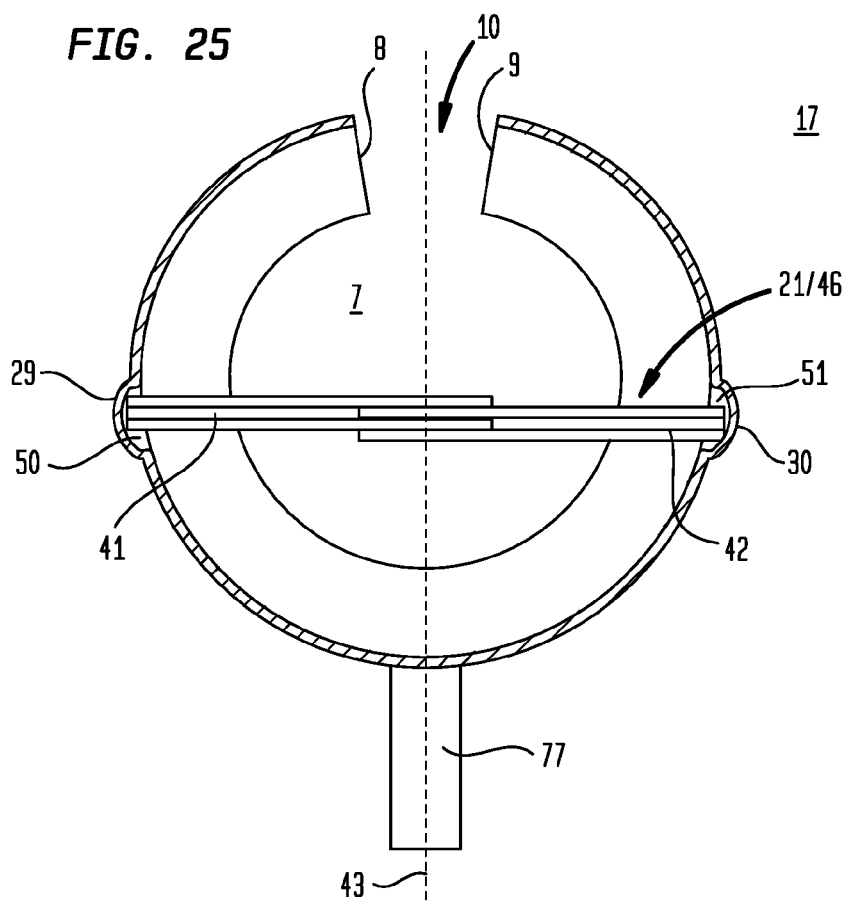
FIG. 25 is a cross-sectional view 25-25 of the particular embodiment of the inventive busing cover shown in FIG. 24.
Figure 26:
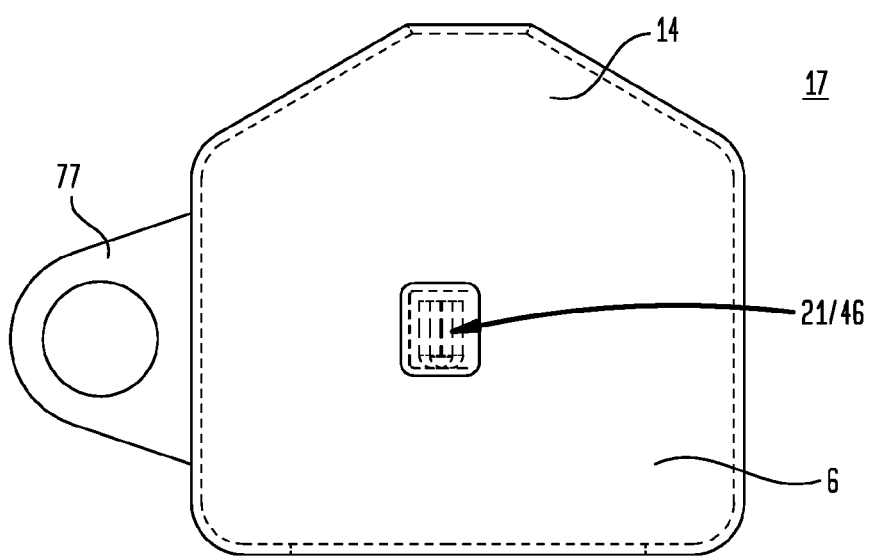
FIG. 26 is a side view of a particular embodiment of the inventive bushing cover.
Figure 27:
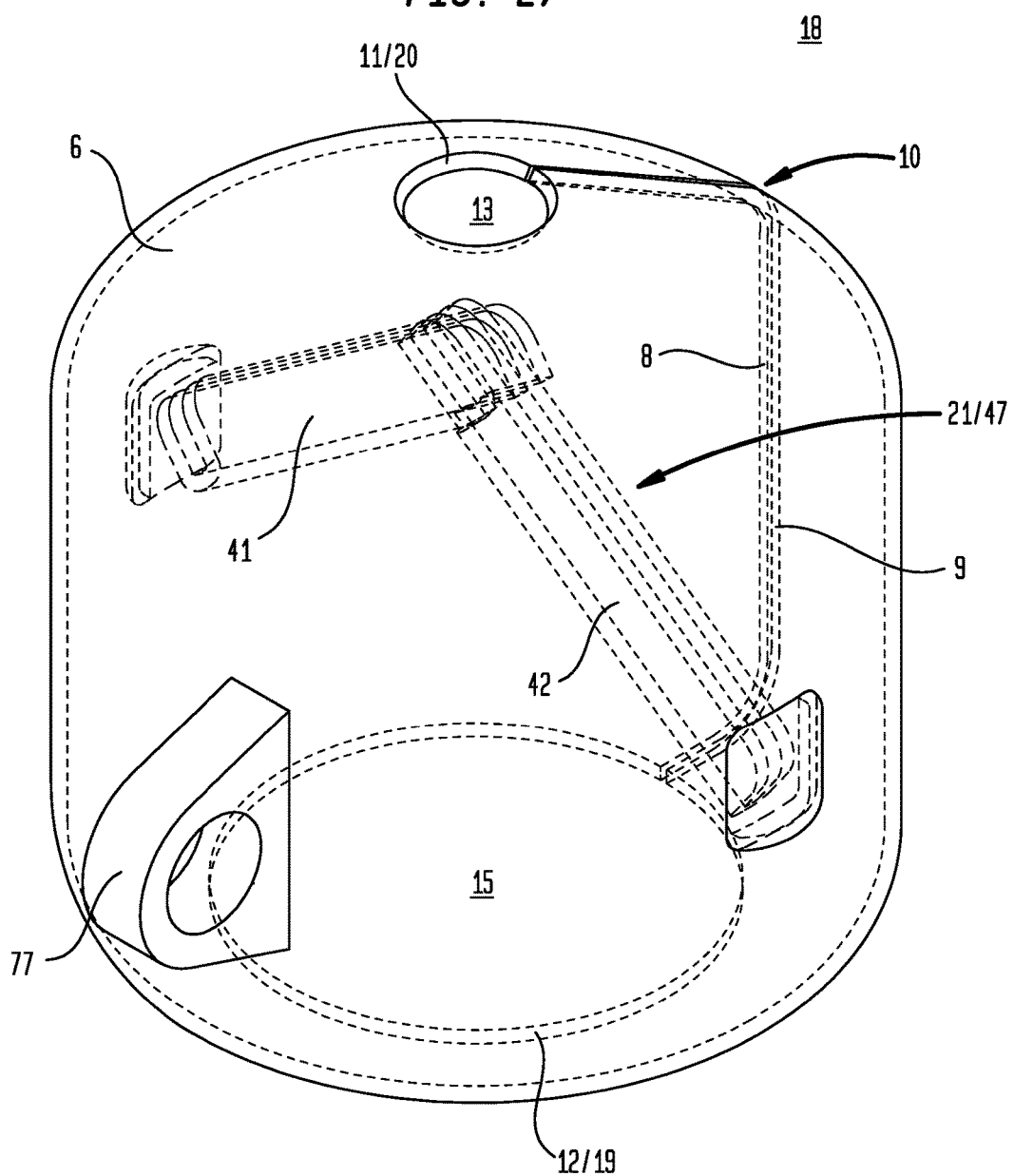
FIG. 27 is a perspective view of a particular embodiment of the inventive bushing cover.
Figure 28:
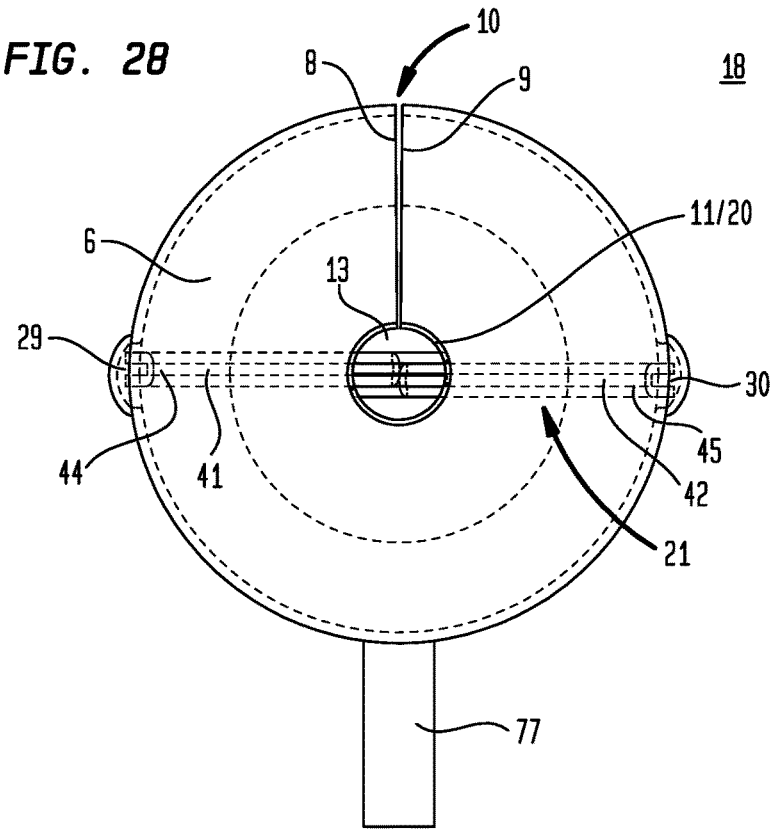
FIG. 28 is a top view of a particular embodiment of the inventive bushing cover.
Figure 29:
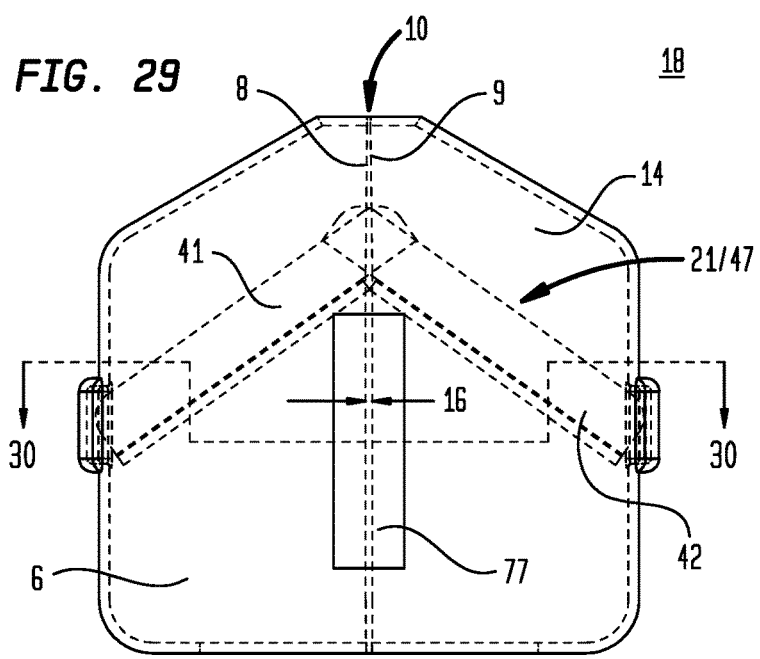
FIG. 29 is an end view of a particular embodiment of the inventive bushing cover.
Figure 30:
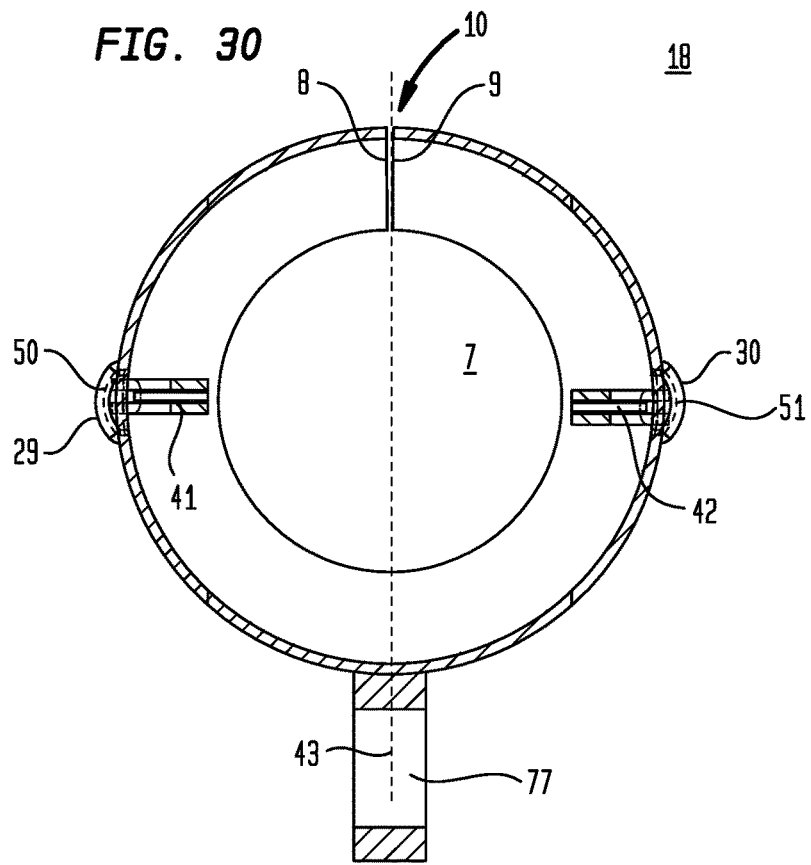
FIG. 30 is a cross-sectional view 30-30 of the particular embodiment of the inventive busing cover shown in FIG. 29.
Figure 31:
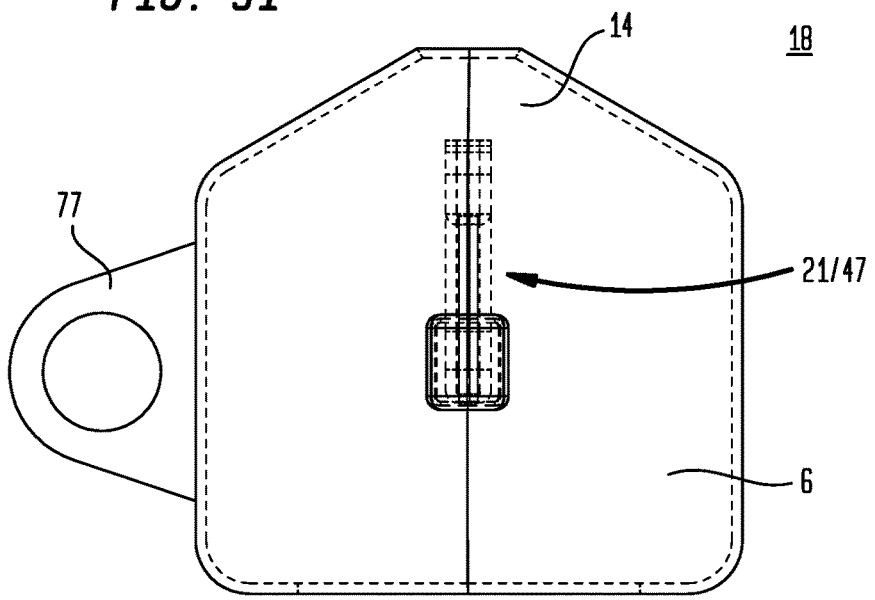
FIG. 31 is a side view of a particular embodiment of the inventive bushing cover.

Now referring primarily to FIG. 22 through FIG. 32H, particular embodiments of the inventive bushing cover (1) can include a body deformation member (21) having a pair of deformation elements (41)(42) rotatably engaged at a deformation element rotation axis (43) medially located between a deformation member first end (44) and a deformation member second end (45) (as shown in the example of FIG. 25 and FIG. 30), each deformation member end (44)(45) correspondingly engaged with opposed body sides (29)(30). The pair of deformation elements (41)(42) can rotate about the deformation element rotation axis (43) between a linear condition (46) and an angulated condition (47) to deform the body (6) to adjust the amount of distance (16) between the pair of edges (8)(9).

Now referring primarily to FIG. 22 through FIG. 32H, the pair of deformation elements (41)(42) in a linear condition

Figure 32:
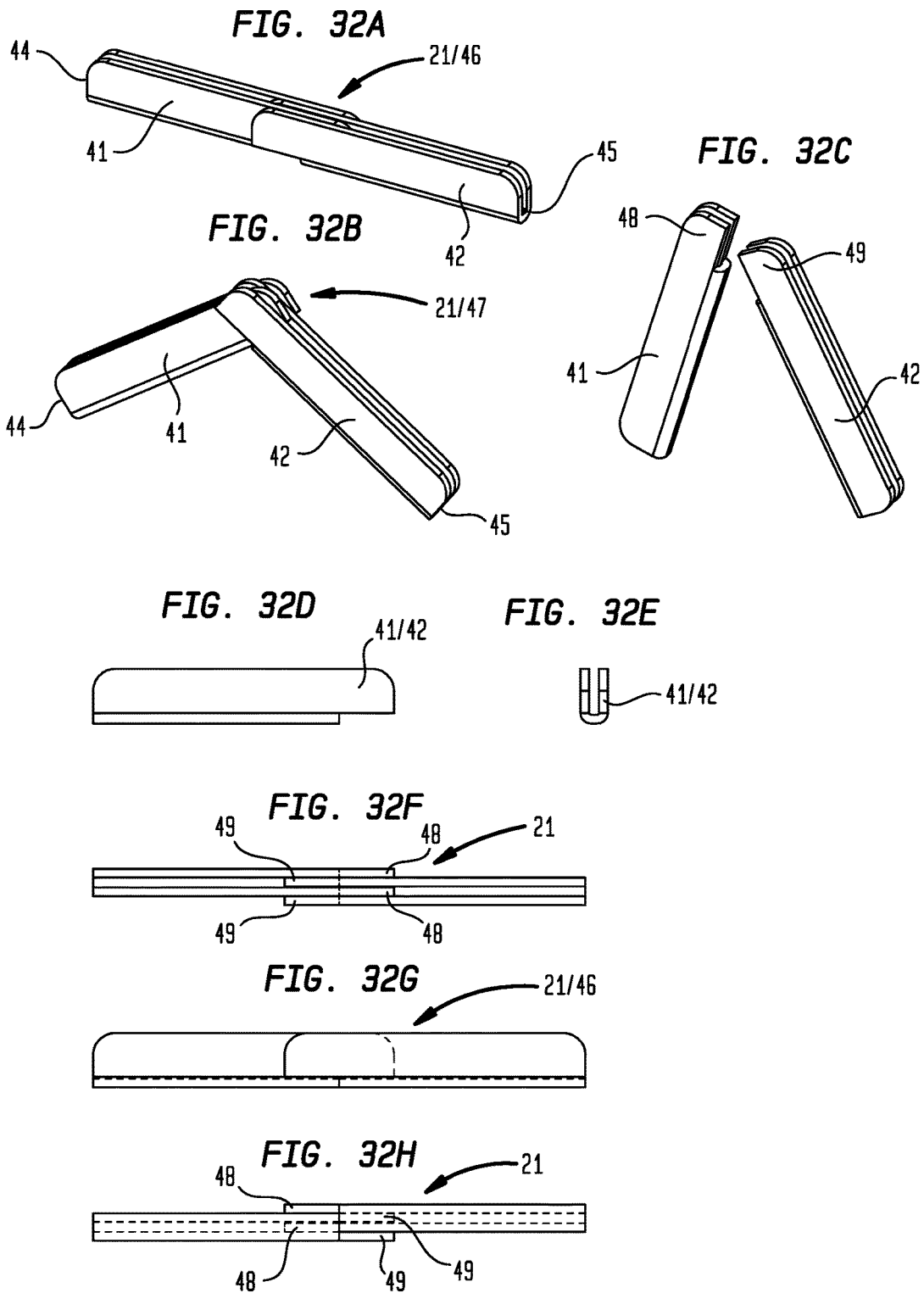
FIG. 32A is a perspective view of a component of a particular embodiment of the inventive bushing cover.
FIG. 32B is a perspective view of a component of a particular embodiment of the inventive bushing cover.
FIG. 32C is a perspective view of a component of a particular embodiment of the inventive bushing cover.
FIG. 32D is a side view of a component of a particular embodiment of the inventive bushing cover.
FIG. 32E is an end view of a component of a particular embodiment of the inventive bushing cover.
FIG. 32F is a bottom view of a component of a particular embodiment of the inventive bushing cover.
FIG. 32G is a side view of a component of a particular embodiment of the inventive bushing cover.
FIG. 32H is a top view of a component of a particular embodiment of the inventive bushing cover.
Figure 33:
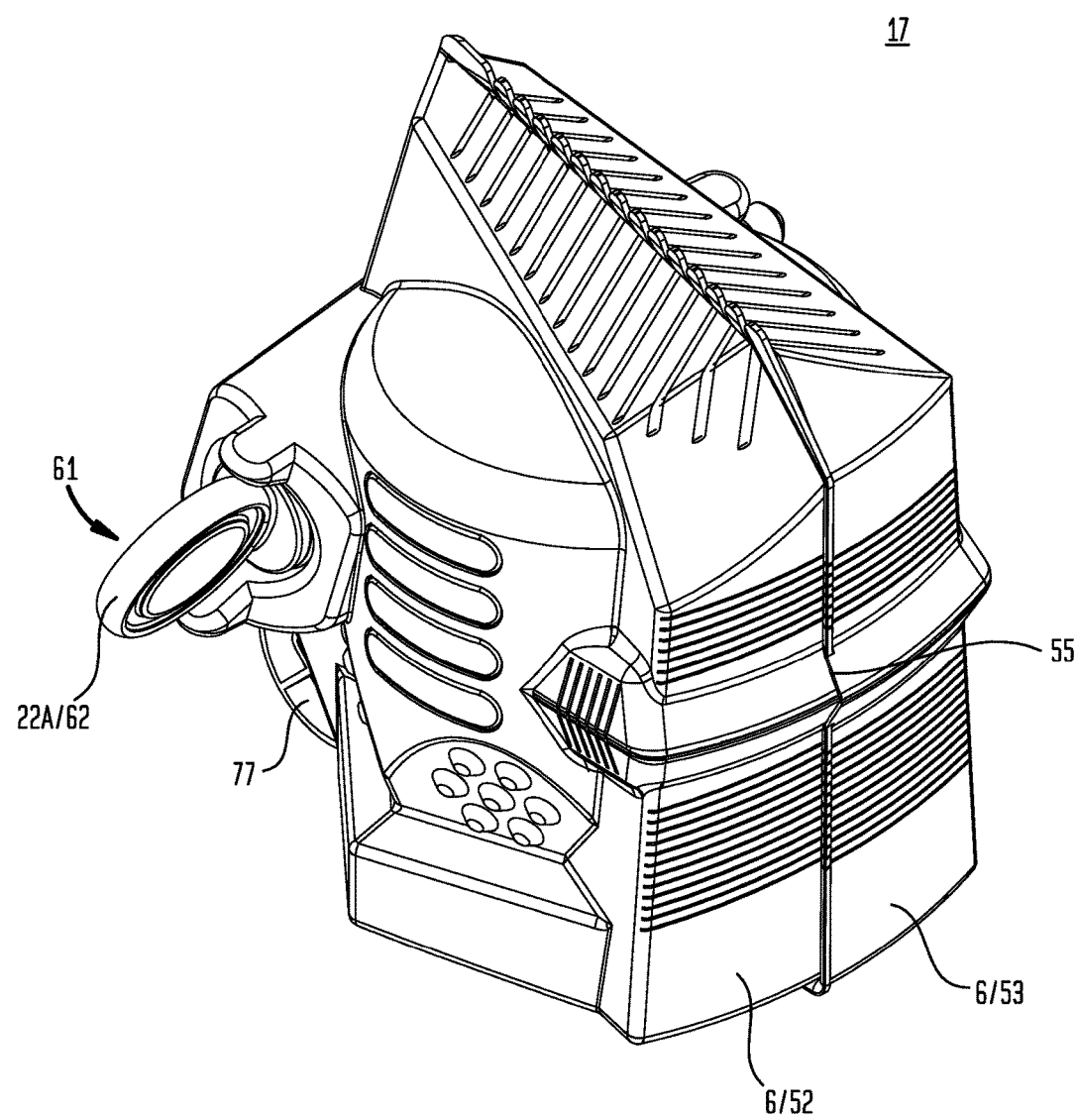
FIG. 33 is a perspective view of a particular embodiment of the inventive bushing cover.
Figure 34:
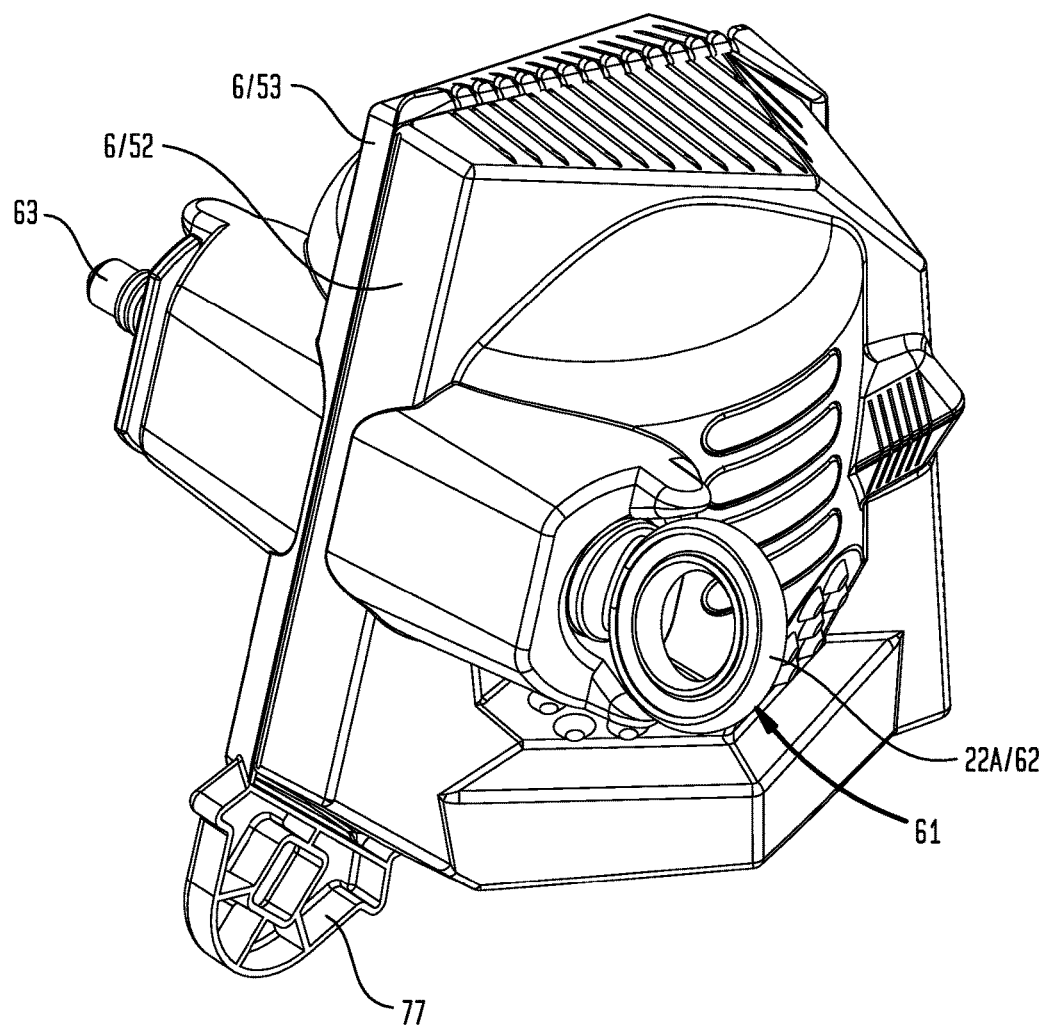
FIG. 34 is a perspective view of a particular embodiment of the inventive bushing cover.
Figure 35:
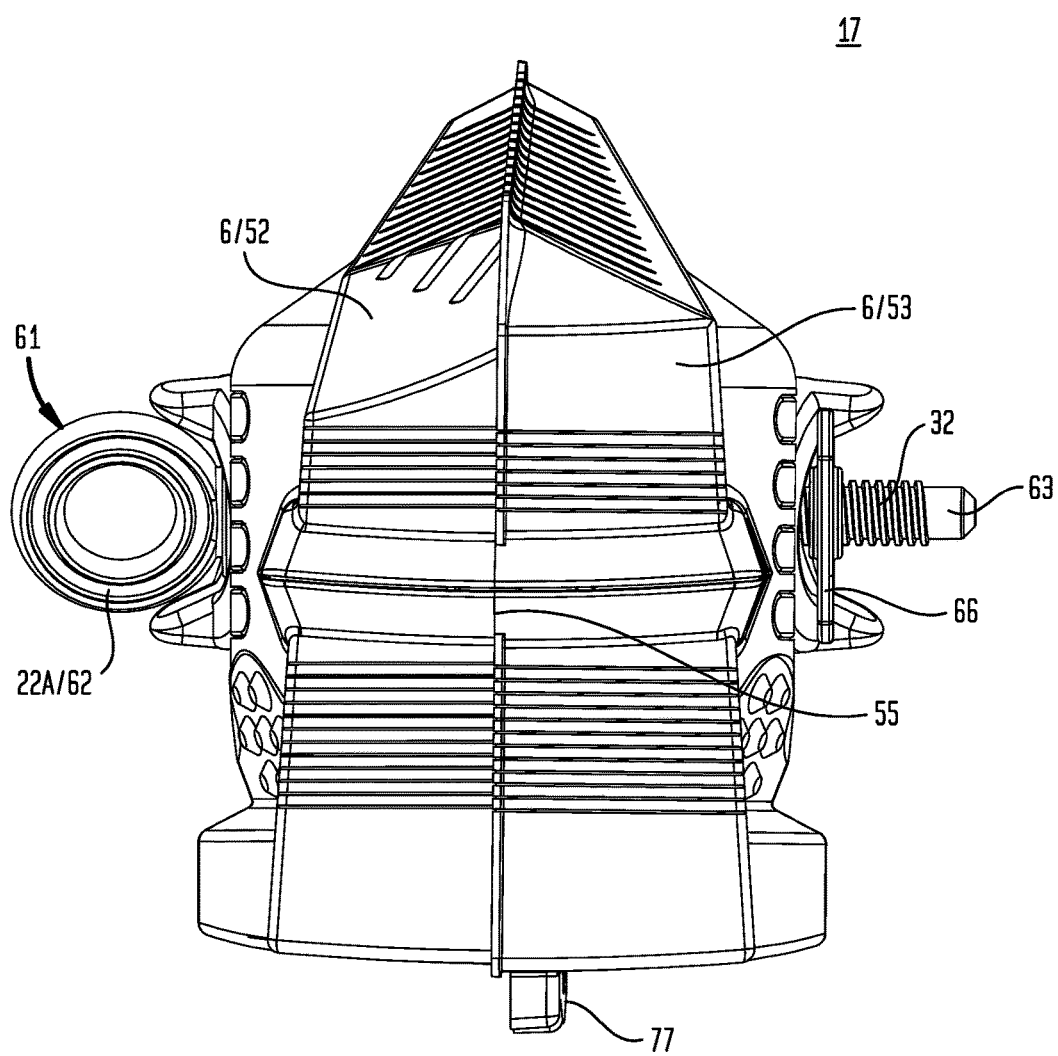
FIG. 35 is a first end view of a particular embodiment of the inventive bushing cover.
Figure 36:
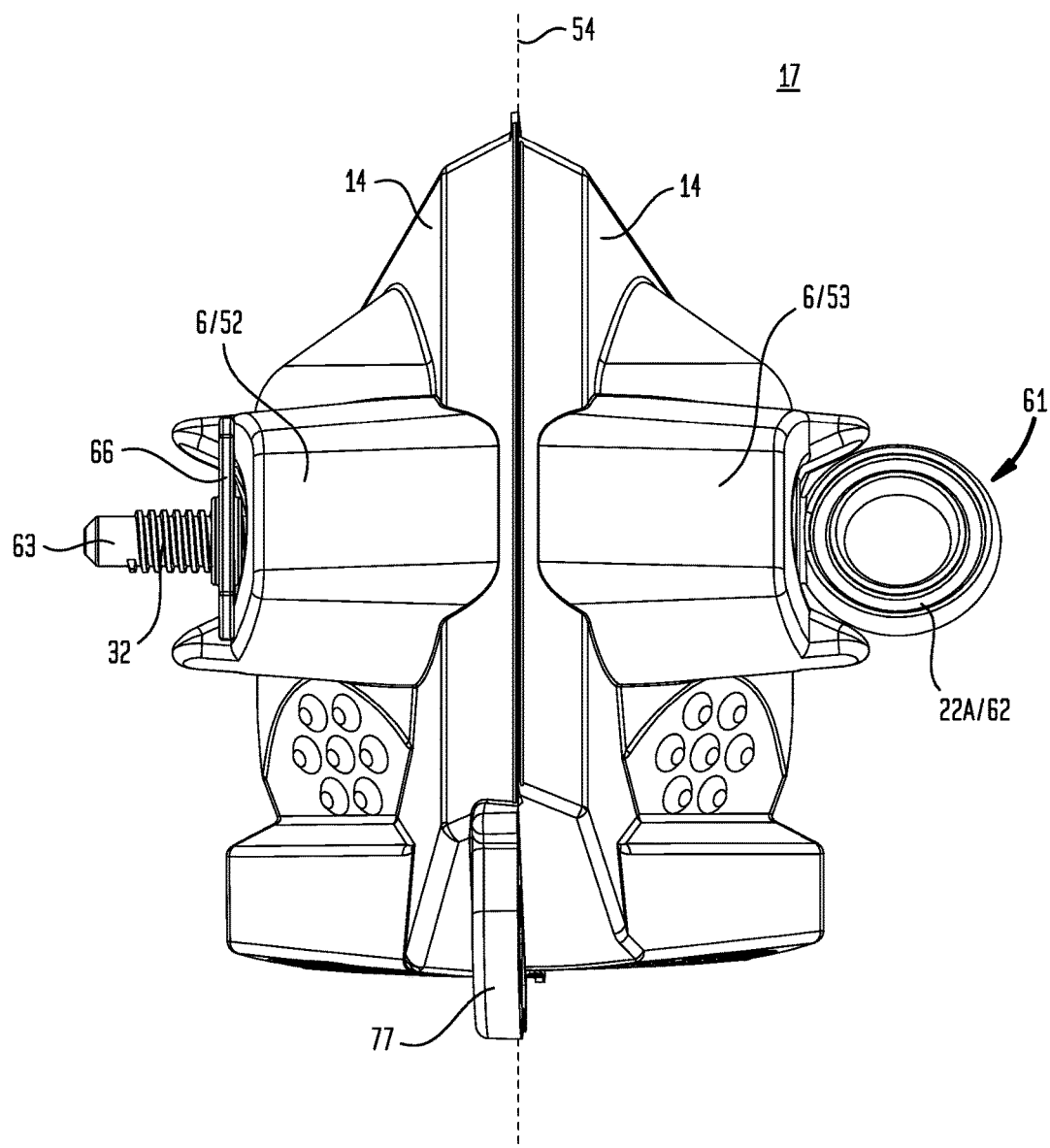
FIG. 36 is a second end view of a particular embodiment of the inventive bushing cover.
Figure 37:
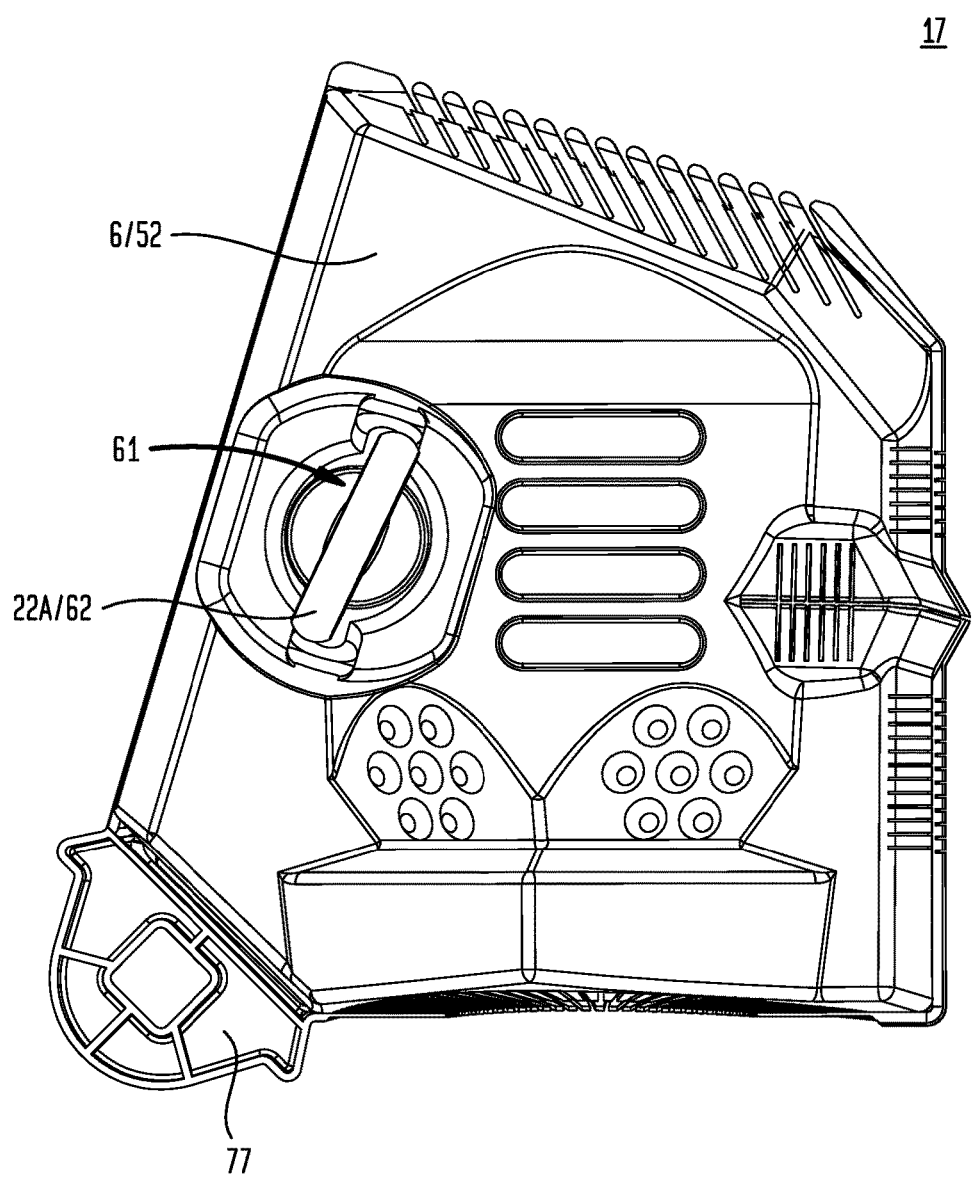
FIG. 37 is a first side view of a particular embodiment of the inventive bushing cover.
Figure 38:
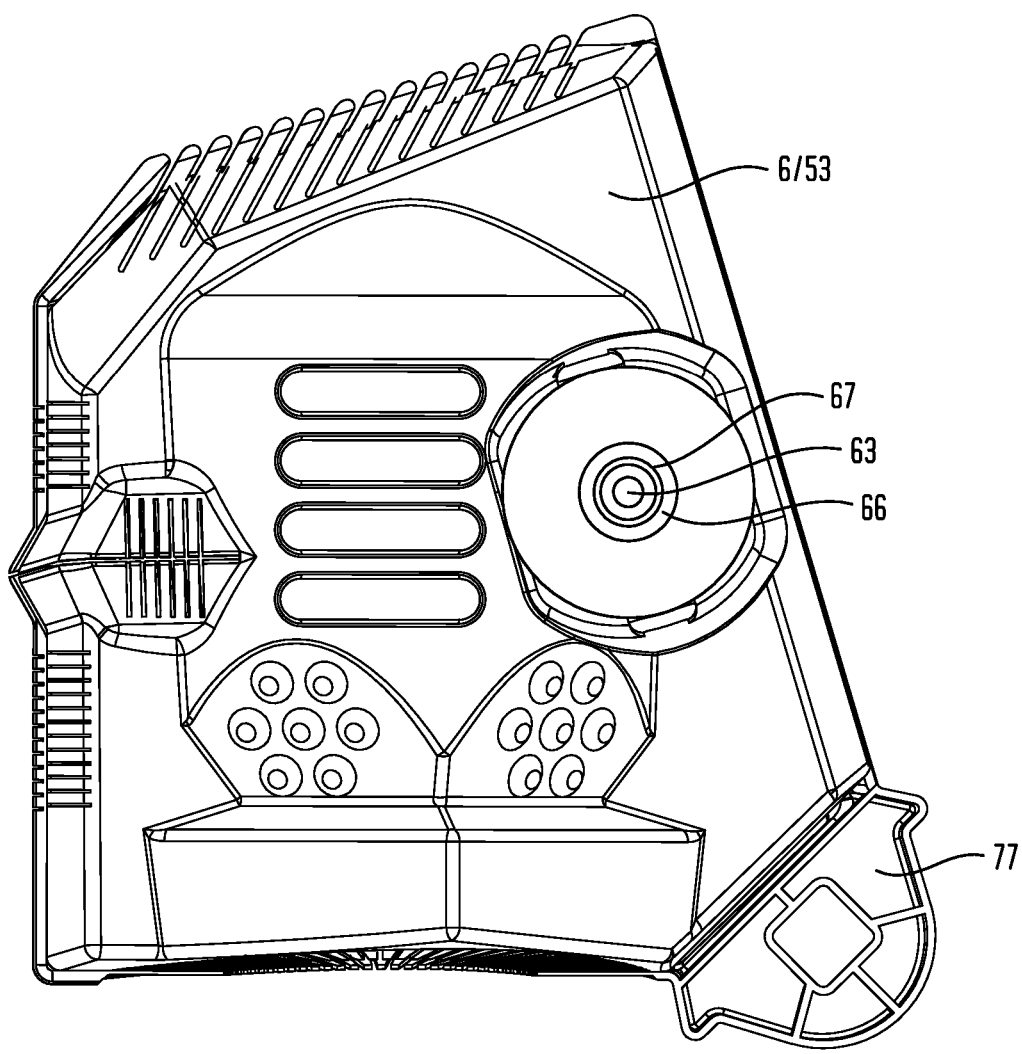
FIG. 38 is a second side view of a particular embodiment of the inventive bushing cover.

(46) (as shown in the example of FIG. 32A) can deform the body (6) to increase the amount of distance (16) between the pair of edges (8)(9), thereby disposing the inventive bushing cover (1) toward a bushing cover open condition (17) (as shown in the example of FIG. 22 through FIG. 26) to allow a bushing (2) to pass through the bottom aperture element opening (15) and be received inside of the hollow interior (7) of the body (6). Alternatively, the pair of deformation elements (41)(42) in an angulated condition (47) (as shown in the example of FIG. 32B) can deform the body (6) to decrease the amount of distance (16) between the pair of edges (8)(9), thereby disposing the inventive bushing cover (1) toward a bushing cover closed condition (18) (as shown in the example of FIG. 27 through FIG. 32) to surround a bushing (2), passed through the bottom aperture element opening (15) and received inside of the hollow interior (7) of the body (6). As to particular embodiments, the bottom aperture element periphery (19) can engage the bushing (2) to securely retain the bushing (2) within the hollow interior (7) of the body (6).

Now referring primarily to FIG. 22 through FIG. 32B, the pair of deformation elements (41)(42) can rotatably engage by interleaved pairs of tabs (48)(49) medially located between the deformation member first and second ends (44)(45). When rotatably engaged, the interleaved pairs of tabs (48)(49) can dispose the pair of deformation elements (41)(42) in the linear condition (46) (as shown in the example of FIG. 32A), thereby disposing the inventive bushing cover (1) toward the bushing cover open condition (17) (as shown in the example of FIG. 22 through FIG. 26). Alternatively, rotation of the pair of deformation elements (41)(42) about the deformation element rotation axis (43) can disengage the interleaved pairs of tabs (48)(49), which can dispose the pair of deformation elements (41)(42) in the angulated condition (47) (as shown in the example of FIG. 32B); thereby disposing the inventive bushing cover (1) toward the bushing cover closed condition (18) (as shown in the example of FIG. 27 through FIG. 31).

Now referring primarily to FIG. 22 through FIG. 31, the inventive bushing cover (1) can further include a pair of recess elements (50)(51) coupled to opposed body sides (29)(30). The pair of recess elements (50)(51) can be configured to correspondingly receive the deformation member first and second ends (44)(45) to supportingly engage the body deformation member (21) with the body internal surface (35).

Again referring primarily to FIG. 22 through FIG. 31, particular embodiments of the inventive bushing cover (1) can further include an annular support element (77) coupled to the body (6). As to particular embodiments, the annular support element (77) can be coupled to the body external surface (34) opposite the slit (10). As to particular embodiments, the annular support element (77) can be configured to matingly engage with an insulated pole (4) which, upon releasable mated engagement with the annular support element (77), can facilitate movement of the inventive bushing cover (1) in a bushing cover open condition (17) to pass the bushing (2) through the bottom aperture element opening (15) and into the hollow interior (7) of the body (6).

Now referring primarily to FIG. 1 and FIG. 22 through FIG. 31, as a bushing (2) passes through the bottom aperture element opening (15) and into the hollow interior (7) of the body (6), the bushing (2) can engage the body deformation member (21), forcibly urging rotation of the pair of deformation elements (41)(42) about the deformation element rotation axis (43) from the linear condition (46) (as shown in the example of FIG. 22 through FIG. 26) to the angulated condition (47), whereby the inventive bushing cover (1) can be disposed in the bushing cover closed condition (18) (as shown in the example of FIG. 27 through FIG. 31) to surround the bushing (2 received inside of the hollow interior (7) of the body (6).

Now referring primarily to FIG. 33 through FIG. 42, particular embodiments of the inventive bushing cover (1) can include a body first portion (52) and a body second portion (53) coupled to rotate about a body portion rotation axis (54) to engage the body first portion (52) and the body second portion (53) at a juncture (55) to enclose a hollow interior (7) of the body (6) which communicates between a top aperture element (11) and a bottom aperture element (12). The body (6) can be configured in any of a wide variety of numerous configurations of varying dimensions, which can be suitable for receiving a corresponding wide variety of numerous configurations of bushings (2) within the hollow interior (7) of the body (6). As an illustrative example, the body (6) can incorporate a cylindrical configuration, to correspondingly incorporate a hollow interior (7) of cylindrical configuration.

Figure 39:
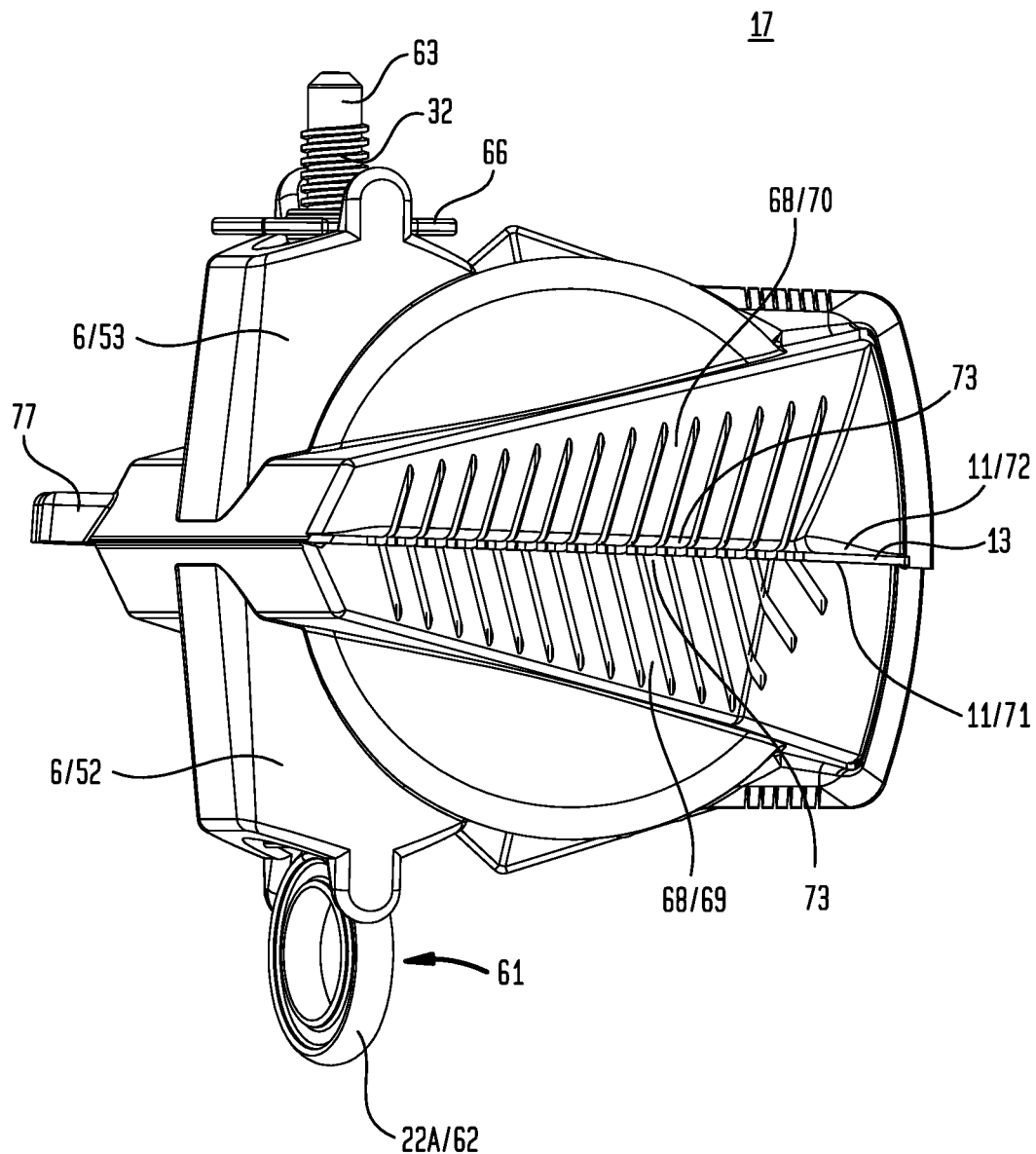
FIG. 39 is a top view of a particular embodiment of the inventive bushing cover.

Now referring primarily to FIG. 39, the top aperture element (11) can bound a top aperture element opening (13) communicating with the hollow interior (7) of the body (6). The top aperture element (11) can be configured to dispose about a conductor (3) extending from a bushing (2) received inside of the hollow interior (7) of the body (6). As to particular embodiments, a generally cylindrical body (6) can have a body upper portion (14) which tapers inwardly approaching a substantially linear top aperture element (11), whereby the inwardly tapering body upper portion (14) can be disposed about a conductor (3) extending from a generally cylindrical bushing (2) received inside of the hollow interior (7) of the generally cylindrical body (6).

Figure 40:
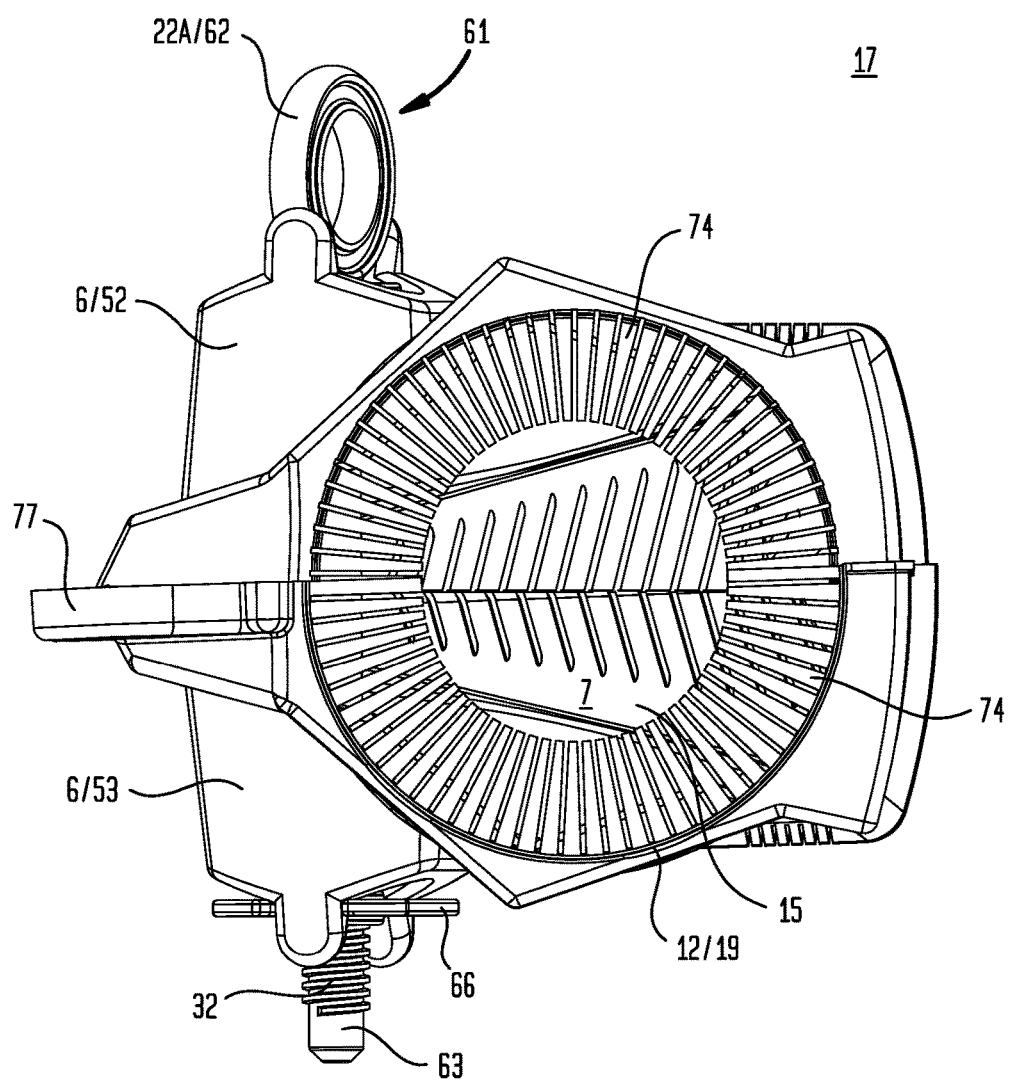
FIG. 40 is a bottom view of a particular embodiment of the inventive bushing cover.

Now referring primarily to FIG. 40, the bottom aperture element (12) can bound a bottom aperture element opening (15) communicating with the hollow interior (7) of the body (6). The bottom aperture element (12) can be configured to dispose about a bushing (5) received inside of the hollow interior (7) of the body (6). As to particular embodiments, the bottom aperture element (12) can bound a generally circular bottom aperture element opening (15), which can insertingly receive and retain a generally cylindrical bushing (2) received inside of the hollow interior (7) of a generally cylindrical body (6).

Now referring primarily to FIG. 33 through FIG. 42, the body first portion (52) and the body second portion (53) can each have one of a pair of securement aperture elements (56)(57) with corresponding securement aperture element openings (58)(59) communicating between the body external surface (34) and the body internal surface (35). The pair of securement aperture elements (56)(57) can be aligned to generate a pass-through (59), which can communicate between the pair of securement aperture elements (56)(57).

Now referring primarily to FIG. 33 through FIG. 40, particular embodiments of the inventive bushing cover (1) can include a securing member (61) having a securing member first end (62) opposite a securing member second end (63). The securing member (61) can be received by the pass-through (60) to fix the body first portion (52) in mated engagement with the body second portion (53) in a bushing cover closed condition (18). As such, a bushing (2) received inside of the hollow interior (7) of the body (6) can be securely retained within the hollow interior (7) of the body (6).

Again referring primarily to FIG. 33 through FIG. 40, the securing member (61) can further include an annular member (22A) coupled to the securing member first end (62). As to particular embodiments, the inventive bushing cover (1) can further include an insulated pole (4) having a pole terminal end (65) configured to matingly engage with the annular member (22A) (as shown in the example of FIG. 1).

Again referring primarily to FIG. 33 through FIG. 40, particular embodiments of the inventive bushing cover (1) can further include a retaining member (66) configured to couple to the securing member second end (63). As an illustrative example, a pair of mated spiral threads (32) can be correspondingly coupled to the securing member second end (63) and about a retaining member aperture element (67) disposed within the retaining member (66). The securing member second end (63) can pass through the retaining member aperture element (67) and can be adjustably coupled to the retaining member (66) by rotation of the securing member second end (63) within the retaining member aperture element (67). Clockwise rotation of the securing member second end (63) can forcibly urge engagement of the body first portion (52) with the body second portion (53) at the juncture (55), thereby surrounding a bushing (2) received inside of the hollow interior (7) of the body (6).

Now referring primarily to FIG. 39, particular embodiments of the inventive bushing cover (1) can further include a plurality of flexible projection elements (68) coupled to the top aperture element periphery (20) of the top aperture element (11). A first portion (69) and a second portion (70) of the plurality of flexible projection elements (68) can extend from opposed top aperture element periphery sides (71)(72) of the top aperture element periphery (20) to correspondingly dispose in opposed relation projection element terminal ends (73) along the juncture (55) of the body first portion (52) and the body second portion (53). As to particular embodiments, the plurality of flexible projection elements (68) can be disposed about a conductor (3) extending from a bushing (2) received inside of the hollow interior (7) of the body (6).

Now referring primarily to FIG. 33 through FIG. 41, particular embodiments of the inventive bushing cover (1) can further include an annular support element (77) coupled to the body (6). As to particular embodiments, the annular support element (77) can be coupled to the body external surface (34) of the body first portion (52) or the body second portion (53) proximate the bottom aperture element (12). As to particular embodiments, the annular support element (77) can be configured to matingly engage with an insulated pole (4) which, upon releasable mated engagement with the annular support element (77), can facilitate movement of the inventive bushing cover (1) in a bushing cover open condition (17) to pass the bushing (2) through the juncture (55) between the body first portion (52) and the body second portion (53) and into the hollow interior (7) of the body (6).

Now referring primarily to FIG. 40, particular embodiments of the inventive bushing cover (1) can further include a plurality of flexible members (74) spaced apart and inwardly radially extending from a bottom aperture element periphery (19) of the bottom aperture element (12). As to particular embodiments, the plurality of flexible members (74) can be disposed about a bushing (2) received inside of the hollow interior (7) of the body (6).

Figure 41:
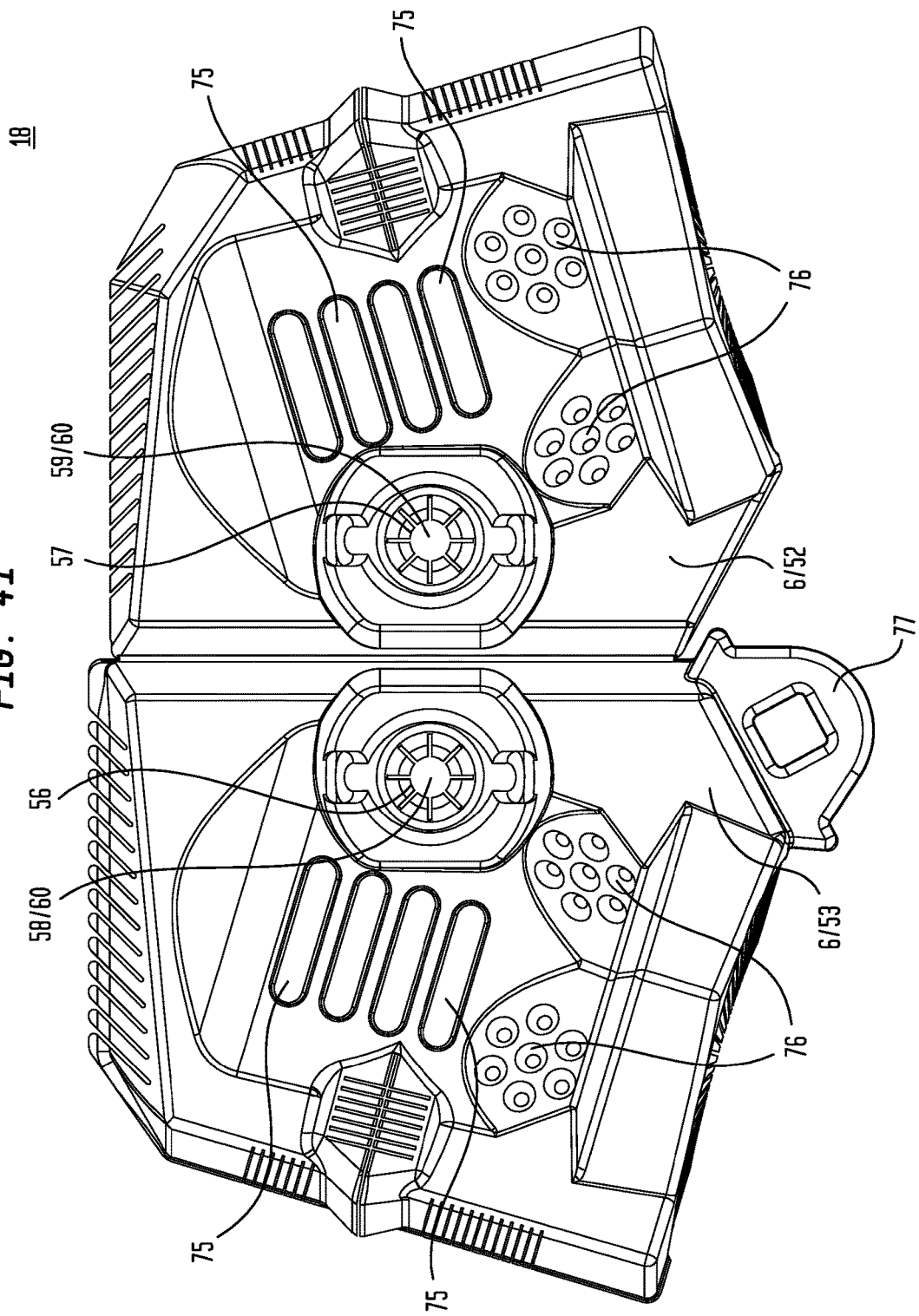
FIG. 41 is a side view of a particular embodiment of the inventive bushing cover.
Figure 42:
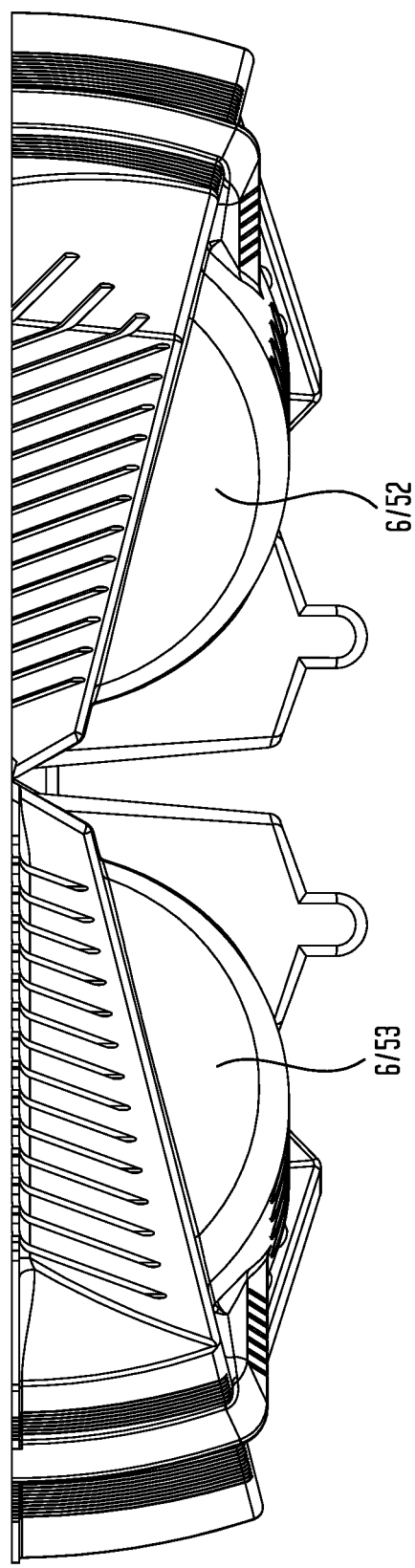
FIG. 42 is a top view of a particular embodiment of the inventive bushing cover.

Now referring primarily to FIG. 41, particular embodiments of the inventive bushing cover (1) can further include a plurality of removable slots (75), which can be disposed in any of a wide variety of locations about the inventive bushing cover (1) suitable for allowing components of a bushing (2) received with the hollow interior (7) of the body (6) to extend through the body (6).

Again referring primarily to FIG. 41, particular embodiments of the inventive bushing cover (1) can further include a plurality of removable ports (76), which can be disposed in any of a wide variety of locations about the inventive bushing cover (1) suitable to permit scanning of a bushing (2) received with the hollow interior (7) of the body (6) by imagery, such as infrared imagery.

A method of producing particular embodiments of the inventive bushing cover (1) can include providing an inventive bushing cover (1) including a body (5) having a pair of edges (8)(9) disposed in opposed relation to define a slit (10) which communicates between a top aperture element (11) and a bottom aperture element (12), the top and bottom aperture elements (11)(12) each communicating with a hollow interior (7) of the body (6), the body (6) resiliently deformable to adjust an amount of distance (16) between the pair of edges (8)(9); and a body deformation member (21) which operably deforms the body (6) to adjust the amount of distance (16) between the pair of edges (8)(9). As to particular embodiments, the method of producing particular embodiments of the inventive bushing cover (1) can further include coupling an annular member (22A) with a linear deformation member (22) or a securing member (61) or an annular support element (77) with the body (6), the annular member (22A) or the annular support element (77) matingly engagable with an insulated pole (4).

A method of producing particular embodiments of the inventive bushing cover (1) can include providing an inventive bushing cover (1) including a body (6) having a body first portion (52) and a body second portion (53) coupled to rotate about a body portion rotation axis (54) to engage the body first portion (52) and the body second portion (53) at a juncture (55) to enclose a hollow interior (7) of the body (6), which communicates between a top aperture element (11) and a bottom aperture element (12); the body first portion (52) and the body second portion (53) each having one of a pair of securement aperture elements (56)(57); a pass-through (60) communicating between the pair of securement aperture elements (56)(57); and a securing member (61) having a securing member first end (62) opposite a securing member second end (63), the securing member (61) receivable by the pass-through (60) to fix the body first portion (52) in mated engagement with the body second portion (53). As to particular embodiments, the method of producing particular embodiments of the inventive bushing cover (1) can further include coupling an annular support element (77) to the body (6), the annular support element (77) matingly engagable with an insulated pole (4).

As to particular embodiments, the inventive bushing cover (1) can be produced from one or more of a wide variety of materials, including resiliently deformable materials, resiliently flexible materials, substantially undeformable materials, substantially inflexible materials, or the like, or combinations thereof. By way of illustrative example, the material can include or consist of: metal, wood, rubber, rubber-like material, plastic, plastic-like material, acrylic, polyamide, polyester, polypropylene, polyvinyl chloride-based materials, silicone-based materials, or the like, or combinations thereof.

As to particular embodiments, the inventive bushing cover (1) or components of the inventive bushing cover (1) can be produced from any of a wide variety of processes depending upon the application, such as press molding, injection molding, fabrication, machining, printing, three-dimensional printing, or the like, or combinations thereof, as one piece or assembled from a plurality of pieces into an embodiment of the inventive bushing cover (1) or provided as a plurality of pieces for assembly into an embodiment of the inventive bushing cover (1).

As to particular embodiments, components of the inventive bushing cover (1) can be coupled to one another by a variety of methods of joining materials, which can include conventional methods for fixedly joining materials or methods for removably joining materials, including but not limited to, adhering, fastening, welding, cementing, crimping, fusing, gluing, sealing, taping, or the like.

A method of covering a bushing (2) using particular embodiments of the inventive bushing cover (1) can include obtaining an inventive bushing cover (1) including a body (6) having a pair of edges (8)(9) disposed in opposed relation to define a slit (10) which communicates between a top aperture element (11) and a bottom aperture element (12), the top and bottom aperture elements (11)(12) each communicating with a hollow interior (7) of the body (6), the body (6) resiliently deformable to adjust an amount of distance (16) between the pair of edges (8)(9); and a body deformation member (21) which operably deforms the body (6) to adjust the amount of distance (16) between the pair of edges (8)(9); deforming the body (6) by operation of the body deformation member (21); adjusting the amount of distance (16) between the pair of edges (8)(9) to allow a bushing (2) to be received by the hollow interior (7) of the body (6); and disposing the bushing (2) inside the hollow interior (7) of the body (6). As to particular embodiments, the method of covering a bushing (2) using particular embodiments of the inventive bushing cover (1) can further include adjusting the amount of distance (16) between the pair of edges (8)(9) to surround the bushing (2) disposed inside of the hollow interior (7) of the body (6).

A method of covering a bushing (2) using particular embodiments of the inventive bushing cover (1) can include obtaining an inventive bushing cover (1) including a body (6) having a body first portion (52) and a body second portion (53) coupled to rotate about a body portion rotation axis (54) to engage the body first portion (52) and the body second portion (53) at a juncture (55) to enclose a hollow interior (7) of the body (6), which communicates between a top aperture element (11) and a bottom aperture element (12); the body first portion (52) and the body second portion (53) each having one of a pair of securement aperture elements (56)(57); a pass-through (60) communicating between the pair of securement aperture elements (56)(57); and a securing member (61) having a securing member first end (62) opposite a securing member second end (63), the securing member (61) receivable by the pass-through (60) to fix the body first portion (52) in mated engagement with the body second portion (53); rotating the body first portion (52) or the body second portion (53) about the body portion rotation axis ( ) 54 to allow the bushing (2) to be received by the hollow interior (7) of the body (6); and disposing the bushing (2) inside the hollow interior (7) of the body (6). As to particular embodiments, the method of covering a bushing (6) using particular embodiments of the inventive bushing cover (1) can further include rotating the body first portion (52) or the body second portion (53) about the body portion rotation axis (54) to surround the bushing (2) disposed inside of the hollow interior (7) of the body (6).

Now referring primarily to FIG. 1, as to particular embodiments, the method can further include obtaining an insulated pole (4) having a pole terminal end (65) configured to matingly engage with an annular member (22A) coupled to the linear deformation member (22) or the securing member (61) or with an annular support element (77) coupled to the body (6). The insulated pole (4) can be releasably matably engaged with the annular member (22A) or with the annular support element (77). The insulated pole (4) can facilitate positionably locating the linear deformation member (22) or the securing member (61) to adjust the amount of distance (16) between the pair of edges (8)(9) or the juncture (55), thereby disposing the inventive bushing cover (1) toward the bushing cover open condition (17) or toward the bushing cover closed condition (18). As to particular embodiments, the insulated pole (4) can be an electrically insulated pole such as a hot stick (5).

As can be easily understood from the foregoing, the basic concepts of the present invention may be embodied in a variety of ways. The invention involves numerous and varied embodiments of a reciprocally telescoping door stop and methods for making and using such door stops including the best mode.

As such, the particular embodiments or elements of the invention disclosed by the description or shown in the figures or tables accompanying this application are not intended to be limiting, but rather exemplary of the numerous and varied embodiments generically encompassed by the invention or equivalents encompassed with respect to any particular element thereof. In addition, the specific description of a single embodiment or element of the invention may not explicitly describe all embodiments or elements possible; many alternatives are implicitly disclosed by the description and figures.

It should be understood that each element of an apparatus or each step of a method may be described by an apparatus term or method term. Such terms can be substituted where desired to make explicit the implicitly broad coverage to which this invention is entitled. As but one example, it should be understood that all steps of a method may be disclosed as an action, a means for taking that action, or as an element which causes that action. Similarly, each element of an apparatus may be disclosed as the physical element or the action which that physical element facilitates. As but one example, the disclosure of a "support" should be understood to encompass disclosure of the act of "supporting"—whether explicitly discussed or not—and, conversely, were there effectively disclosure of the act of "supporting", such a disclosure should be understood to encompass disclosure of a "support" and even a "means for supporting." Such alternative terms for each element or step are to be understood to be explicitly included in the description.

In addition, as to each term used it should be understood that unless its utilization in this application is inconsistent with such interpretation, common dictionary definitions should be understood to be included in the description for each term as contained in the Random House Webster's Unabridged Dictionary, second edition, each definition hereby incorporated by reference.

All numeric values herein are assumed to be modified by the term "about", whether or not explicitly indicated. For the purposes of the present invention, ranges may be expressed as from "about" one particular value to "about" another particular value. When such a range is expressed, another embodiment includes from the one particular value to the other particular value. The recitation of numerical ranges by endpoints includes all the numeric values subsumed within that range. A numerical range of one to five includes for example the numeric values 1, 1.5, 2, 2.75, 3, 3.80, 4, 5, and so forth. It will be further understood that the endpoints of each of the ranges are significant both in relation to the other endpoint, and independently of the other endpoint. When a value is expressed as an approximation by use of the antecedent "about," it will be understood that the particular value forms another embodiment. The term "about" generally refers to a range of numeric values that one of skill in the art would consider equivalent to the recited numeric value or having the same function or result. Similarly, the antecedent "substantially" means largely, but not wholly, the same form, manner or degree and the particular element will have a range of configurations as a person of ordinary skill in the art would consider as having the same function or result. When a particular element is expressed as an approximation by use of the antecedent "substantially," it will be understood that the particular element forms another embodiment.

Moreover, for the purposes of the present invention, the term "a" or "an" entity refers to one or more of that entity unless otherwise limited. As such, the terms "a" or "an", "one or more" and "at least one" can be used interchangeably herein.

Thus, the applicant(s) should be understood to claim at least: i) each of the bushing covers herein disclosed and described, ii) the related methods disclosed and described, iii) similar, equivalent, and even implicit variations of each of these devices and methods, iv) those alternative embodiments which accomplish each of the functions shown, disclosed, or described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) methods and apparatuses substantially as described hereinbefore and with reference to any of the accompanying examples, x) the various combinations and permutations of each of the previous elements disclosed.

The background section of this patent application provides a statement of the field of endeavor to which the invention pertains. This section may also incorporate or contain paraphrasing of certain United States patents, patent applications, publications, or subject matter of the claimed invention useful in relating information, problems, or concerns about the state of technology to which the invention is drawn toward. It is not intended that any United States patent, patent application, publication, statement or other information cited or incorporated herein be interpreted, construed or deemed to be admitted as prior art with respect to the invention.

The claims set forth in this specification, if any, are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent application or continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

Additionally, the claims set forth in this specification, if any, are further intended to describe the metes and bounds of a limited number of the preferred embodiments of the invention and are not to be construed as the broadest embodiment of the invention or a complete listing of embodiments of the invention that may be claimed. The applicant does not waive any right to develop further claims based upon the description set forth above as a part of any continuation, division, or continuation-in-part, or similar application.

The invention claimed is:

1. A bushing cover, comprising:
a body having a body first portion and a body second portion coupled to rotate about a body portion rotation axis to engage said body first portion and said body second portion at a juncture to enclose a hollow interior of said body which communicates between a substantially linear top aperture element and a bottom aperture element;
wherein said body second portion is outwardly offset from said body first portion at said juncture when said bushing cover disposes toward a bushing cover closed condition to allow said body second portion to overlap said body first portion for adjustable overlapping engagement.

2. The bushing cover of claim 1, further comprising a pair of securement aperture elements one each correspondingly coupled to said body first portion and said body second portion.

3. The bushing cover of claim 2, further comprising a pass-through communicating between said pair of securement aperture elements.

4. The bushing cover of claim 3, further comprising a securing member having a securing member first end opposite a securing member second end, said securing member receivable by said pass-through to adjust an amount of distance between said body first portion and said body second portion at said juncture; and
an annular member coupled to said securing member first end, said annular member configured to matingly engage with a pole terminal end of an insulated pole.

5. The bushing cover of claim 1, further comprising a plurality of flexible projection elements coupled to a top aperture element periphery of said top aperture element, a first portion and a second portion of said plurality of flexible projection elements extending from opposed top aperture element periphery sides of said top aperture element periphery to correspondingly dispose in opposed relation projection element terminal ends of said projection elements along said juncture of said body first portion and said body second portion.

6. The bushing cover of claim 5, further comprising a plurality of flexible members spaced apart and inwardly radially extending from a bottom aperture element periphery of said bottom aperture element.

7. A method of producing a bushing cover, comprising:
rotatably coupling a body first portion and a body second portion of a body to rotate about a body portion rotation axis to engage said body first portion and said body second portion at a juncture to enclose a hollow interior of said body which communicates between a substantially linear top aperture element and a bottom aperture element; and
configuring said body second portion to be outwardly offset from said body first portion at said juncture when said bushing cover disposes toward a bushing cover closed condition to allow said body second portion to overlap said body first portion for adjustable overlapping engagement.

8. The method of claim 7, further comprising correspondingly coupling one of a pair of securement aperture elements to said body first portion and said body second portion.

9. The method of claim 8, further comprising disposing a pass-through between said pair of securement aperture elements.

10. The method of claim 9, further comprising providing a securing member having an annular member coupled to a securing member first end;
wherein said securing member is receivable by said pass-through to fix said body first portion in mated engagement with said body second portion; and
wherein said annular member is configured to matingly engage with a pole terminal end of an insulated pole.

11. The method of claim 10, further comprising coupling a retaining member to a securing member second end of said securing member.

12. The method of claim 7, further comprising coupling a plurality of flexible projection elements to a top aperture element periphery of said top aperture element, a first portion and a second portion of said plurality of flexible projection elements extending from opposed top aperture element periphery sides of said top aperture element periphery to correspondingly dispose in opposed relation projection element terminal ends of said projection elements along said juncture of said body first portion and said body second portion.

13. The method of claim 12, further comprising coupling a plurality of flexible members spaced apart and inwardly radially extending from a bottom aperture element periphery of said bottom aperture element.

14. A method of covering a bushing, comprising:
obtaining a bushing cover, including:
a body having a body first portion and a body second portion coupled to rotate about a body portion rotation axis to engage said body first portion and said body second portion at a juncture to enclose a hollow interior of said body which communicates between a substantially linear top aperture element and a bottom aperture element;
wherein said body second portion is outwardly offset from said body first portion at said juncture when said bushing cover disposes toward a bushing cover closed condition to allow said body second portion to overlap said body first portion for adjustable overlapping engagement;
passing said bushing between said body first portion and said body second portion at said juncture; and
disposing said bushing cover toward said bushing cover closed condition.

15. The method of claim 14, wherein said bushing cover further includes:
a pair of securement aperture elements one each correspondingly coupled to said body first portion and said body second portion;
a pass-through communicating between said pair of securement aperture elements; and
a securing member having a securing member first end opposite a securing member second end, said securing member receivable by said pass-through to adjust an amount of distance between said body first portion and said body second portion at said juncture; and
said method further comprising disposing said securing member in said pass-through to adjust an amount of distance between said body first portion and said body second portion at said juncture.

16. The method of claim 15, wherein said bushing cover further includes:
a retaining member configured to couple to said securing member second end; and
a pair of mated spiral threads correspondingly coupled to said securing member second end and about a retaining member aperture element disposed within said retaining member; and
said method further comprising rotating said securing member second end within said retaining member aperture element to adjust an amount of distance between said body first portion and said body second portion at said juncture.

17. The method of claim 16, wherein said securing member further includes:
an annular member coupled to said securing member first end; and
said method further comprising matingly engaging a pole terminal end of a pole with said annular member.

18. The method of claim 17, further comprising moving said pole having said terminal end of said pole matingly engaged with said annular member to allow a bushing to pass between said body first portion and said body second portion at said juncture.

19. The method of claim 18, further comprising rotating said securing member second end within said retaining member aperture element to locate said body first portion and said body second portion in fixed adjacent relation at said juncture to enclose said bushing inside of said hollow interior of said body.

20. The method of claim 14, wherein said bushing cover further includes:
a plurality of flexible projection elements coupled to a top aperture element periphery of said top aperture element, a first portion and a second portion of said plurality of flexible projection elements extending from opposed top aperture element periphery sides of said top aperture element periphery to correspondingly dispose in opposed relation projection element terminal ends of said projection elements along said juncture of said body first portion and said body second portion; and
said method further comprising locating said body first portion and said body second portion in fixed adjacent relation at said juncture to flexingly engage said plurality of flexible projection elements about an electrical conductor extending from said bushing.

21. The method of claim 20, wherein said bushing cover further includes:
a plurality of flexible members spaced apart and inwardly radially extending from a bottom aperture element periphery of said bottom aperture element; and
said method further comprising locating said body first portion and said body second portion in fixed adjacent relation at said juncture to flexingly engage said plurality of flexible projection members about said bushing.

* * * * *